(12) United States Patent
Sugawara

(10) Patent No.: US 8,896,084 B2
(45) Date of Patent: Nov. 25, 2014

(54) SEMICONDUCTOR DEVICE

(75) Inventor: Yoshitaka Sugawara, Hitachi (JP)

(73) Assignees: Yoshitaka Sugawara, Hitachi-shi (JP); Fuji Electric Co., Ltd., Kawasaki-shi (JP)

(*) Notice: Subject to any disclaimer, the term of this patent is extended or adjusted under 35 U.S.C. 154(b) by 115 days.

(21) Appl. No.: 13/578,434

(22) PCT Filed: Feb. 23, 2011

(86) PCT No.: PCT/JP2011/054000
§ 371 (c)(1),
(2), (4) Date: Aug. 10, 2012

(87) PCT Pub. No.: WO2011/105434
PCT Pub. Date: Jan. 9, 2011

(65) Prior Publication Data
US 2012/0313212 A1 Dec. 13, 2012

(30) Foreign Application Priority Data
Feb. 23, 2010 (JP) .................. 2010-055070
Mar. 31, 2010 (JP) .................. 2010-094448

(51) Int. Cl.
*H01L 29/47* (2006.01)
(52) U.S. Cl.
CPC ......... *H01L 29/0615* (2013.01); *H01L 29/2003* (2013.01); *H01L 29/1608* (2013.01); *H01L 29/872* (2013.01); *H01L 29/8611* (2013.01); *H01L 29/1602* (2013.01); *H01L 29/0619* (2013.01); *H01L 29/0638* (2013.01)
USPC ........... 257/471; 257/475; 257/478; 257/653; 257/E29.338; 257/E29.327

(58) Field of Classification Search
None
See application file for complete search history.

(56) References Cited

U.S. PATENT DOCUMENTS

| 5,789,311 | A | | 8/1998 | Ueno et al. |
| 6,054,748 | A | * | 4/2000 | Tsukuda et al. ............ 257/496 |

(Continued)

FOREIGN PATENT DOCUMENTS

| CN | 101091260 A | 12/2007 |
| JP | 58-216473 A | 12/1983 |

(Continued)

OTHER PUBLICATIONS

Japanese Office Action dated Jan. 28, 2014, issued in Japanese Patent Application No. 2012-501824 with English Translation. (4 pages).

(Continued)

*Primary Examiner* — Yasser A Abdelaziez
(74) *Attorney, Agent, or Firm* — Westerman, Hattori, Daniels & Adrian, LLP

(57) ABSTRACT

A semiconductor device includes a first semiconductor region of a first conductivity type and formed of a material having a band gap wider than that of silicon; a first layer selectively disposed on a surface of and forming a first junction with the first semiconductor region; a second layer selectively disposed on the first semiconductor region and forming a second junction with the first semiconductor region; a first diode formed by a region including the first junction; a second diode formed by a region including the second junction; and a fourth semiconductor region of a second conductivity type and disposed in the first semiconductor region, between and contacting the first and second junctions. A recess and elevated portion are disposed on the first semiconductor region. The first and the second junctions are formed at different depths. The second diode has a lower built-in potential than the first diode.

18 Claims, 19 Drawing Sheets

(51) Int. Cl.
*H01L 29/06* (2006.01)
*H01L 29/872* (2006.01)
*H01L 29/861* (2006.01)
H01L 29/20 (2006.01)
H01L 29/16 (2006.01)

(56) References Cited

U.S. PATENT DOCUMENTS

| | | |
|---|---|---|
| 6,844,251 B2 | 1/2005 | Shenai et al. |
| 7,274,083 B1 | 9/2007 | Sankin et al. |
| 2007/0170436 A1 | 7/2007 | Sugawara |
| 2007/0278609 A1 | 12/2007 | Harris et al. |
| 2008/0197439 A1 | 8/2008 | Goerlach et al. |
| 2009/0045413 A1* | 2/2009 | Ishii et al. ............. 257/77 |
| 2009/0230405 A1 | 9/2009 | Yamamoto et al. |
| 2010/0025693 A1 | 2/2010 | Malhan et al. |
| 2010/0032686 A1 | 2/2010 | Ishii et al. |

FOREIGN PATENT DOCUMENTS

| | | |
|---|---|---|
| JP | 02-091975 A | 3/1990 |
| JP | 05-110061 A | 4/1993 |
| JP | 08-097441 A | 4/1996 |
| JP | 08-512430 A | 12/1996 |
| JP | 2000-252478 A | 9/2000 |
| JP | 2002-319685 A | 10/2002 |
| JP | 2005-223220 A | 8/2005 |
| JP | 2008-211171 A | 9/2006 |
| JP | 2009-224603 A | 10/2009 |
| JP | 2009-535853 A | 10/2009 |
| JP | 2009-539247 A | 11/2009 |
| WO | 95/02258 A1 | 1/1995 |
| WO | 2007/036455 A2 | 4/2007 |

OTHER PUBLICATIONS

Translation of International Preliminary Report of Patentability, Forms PCT/IB/338 and PCT/IPEA/409, dated Oct. 26, 2012.
The Institute of Electrical Engineers of Japan, "Power Device IC Handbook" 1st Edition, Corona Publishing Co., Ltd., 1996, p. 97-98.
Mori, Mutsuhiro et al., "A Novel Soft and Fast Recovery Diode (SFD) With Thin P-Layer Formed by Al-Si Electrode", Proceedings of 3rd International Symposium on Power Semiconductor Devices and ICs, 1991, p. 113-117.
Sugawara, Yoshitaka, "SiC Power Devices for High-Power Conversion", The Japan Society of Applied Physics, 2001, vol. 70, No. 5, p. 530-535.
Alexandrov, P., et al., "4H-SiC MPS Diode Fabrication and Characterization in an Inductively Loaded Half-Bridge Inverter up to 100kW", Materials Science Forum, 2002, vols. 389-393, p. 1177-1180.
Ang, Simon S., "A v-groove Schottky/pn diode", Microelectronics Journal, 1989, vol. 20, No. 5, Elsevier Science Publishers Ltd., p. 7-12.
International Search Report of PCT/JP2011/054000, mailing date of May 31, 2011.
Extended European Search Report dated Mar. 19, 2014, issued in corresponding European Patent Application No. 11747394.2 (8 pages).
Office Action dated Aug. 29, 2014, issued in corresponding Chinese Patent Application No. 201180008847.9, with partial English Translation (10 pages).

* cited by examiner

US 8,896,084 B2

SEMICONDUCTOR DEVICE

TECHNICAL FIELD

The present invention relates to a semiconductor device.

BACKGROUND ART

A bipolar semiconductor device has conventionally been used for high-withstand-voltage uses such as a pn-junction diode formed using silicon (Si) as the semiconductor material. This is because, in the pn-junction diode, injection of minority carriers causes variation of the conductivity of the drift layer and thus, internal resistance can be reduced significantly though the built-in voltage of the junction is high compared to that of a unipolar semiconductor device such as a Schottky barrier diode. For high-withstand-voltage uses, a drift layer of a semiconductor device is set to be thick and has a high resistance. Consequently, use of a pn-junction diode capable of reducing stationary loss is advantageous. However, the pn-junction diode has a large amount of accumulated carriers remaining in the drift layer when a switching operation thereof is turned off and therefore, significant time is consumed for the accumulated carriers to vanish and the reverse recovery current thereof becomes large. Consequently, problems arise in that the switching speed of the pn-junction diode becomes slow and the switching loss becomes large.

To solve these problems, a complex diode has been proposed that is formed by combining the pn-junction diode and a diode having a built-in potential that is lower than that of the pn-junction diode. The diode having the built-in potential that is lower than that of the pn-junction diode is a Schottky barrier diode, or a shallow pn-junction diode including a p-layer that is shallower than a p-layer constituting the pn-junction diode and having an impurity concentration that is lower than that of the p-layer constituting the pn-junction diode (hereinafter, "shallow p-n layer").

More specifically, such diodes have been proposed and fully utilized as: an Si complex diode having an MPS (Merged Pin/Schottky) structure formed by combining pn-junctions and Schottky barriers as depicted in FIG. 18 (an MPS diode) and an Si complex diode having an SFD (Soft and Fast recovery Diode) structure formed by combining a pn-junction and a shallow p-n junction as depicted in FIG. 19 (an SFD diode).

FIG. 18 is a cross-sectional diagram of a conventional complex diode. A low-withstand-voltage MPS diode depicted in FIG. 18 has an n⁻-epitaxial layer to be an n⁻ drift layer 182 disposed on the anterior surface of an n⁺-Si substrate 181. P-n junction barriers and Schottky barriers are present on the surface of the n⁻-drift layer 182. More specifically, multiple p⁺-regions 183 are selectively disposed in the surface layer of the n⁻-drift layer 182, and pn-junctions are formed by alternating and repeated disposition of the n⁻-drift layer 182 and the p⁺-regions 183.

A Schottky contact 184 is formed on the anterior surface of the Si substrate 181 and is in contact with the p⁺-regions 183 and the drift layer 182. An ohmic contact 185 is disposed on the posterior surface of the Si substrate 181 and is in contact with the Si substrate 181. The P⁺-regions 183 formed in the outmost portions each extend to a junction termination extension (JTE) region 190. A passivation film 191 is disposed on the anterior surface of the Si substrate 181 and covers the n⁻-drift layer 182 that is exposed in a portion of each of the p+-regions 183 at ends and the junction termination extension regions 190.

In the above MPS diode, an operation of the Schottky conjunction diode is dominating in a small-current region and a low forward voltage is obtained while an operation of the pn-conjunction diode is dominating in a large-current region and a forward voltage is obtained that is lower than that of the Schottky barrier diode. Therefore, compared in all the current regions, the stationary loss is reduced. In the MPS diode, the majority of the accumulated carriers remaining in the drift layer are discharged through the Schottky barrier when the switching operation is turned off and therefore, the accumulated carrier vanishing time period can be shortened. As a result, the MPS diode is characterized by a high switching speed and low switching loss (see, e.g., Nonpatent Literature 1).

FIG. 19 is a cross-sectional diagram of another example of a conventional complex diode. An SFD diode depicted in FIG. 19 has an n-epitaxial layer to be an n-drift layer 202 disposed on the anterior surface of an n⁺-Si substrate 201. A p-n junction barrier and a shallow p-n junction barrier are present on the surface of the n-drift layer 202. More specifically, a p⁺-region 203 is selectively disposed in a surface layer of the n-drift layer 202, and a pn-junction is formed by the n-drift layer 202 and the p⁺-region 203.

In the surface layer of the n-drift layer 202, a shallow p-region 204 is selectively disposed that is shallower than the p⁺-region 203 and has an impurity concentration that is lower than that of the p⁺-region 203. The shallow p-region 204 is in contact with the p⁺-region 203. The Schottky contact 205 is formed on the anterior surface of the Si substrate 201 and is in contact with the p⁺-region 203 and the shallow p-region 204. An ohmic contact 206 is disposed on the posterior surface of the Si substrate 201 and is in contact with the Si substrate 201. The SFD diode has a breakdown voltage of, for example, a 600-V class.

In the above SFD diode, an operation of the shallow pn-conjunction diode is dominating in a small-current region while an operation of the pn-conjunction diode is dominating in a large-current region. Therefore, in the large-current region during use, a significant conductivity variation of the pn-junction diode and a low forward voltage are obtained and thus, a low stationary loss is maintained similarly to a diode including only a pn-junction. On the other hand, in the SFD diode, the majority of the accumulated carriers remaining in the drift layer are discharged through the shallow pn-junction when the switching operation is turned off and the accumulated carrier vanishing time period can be shortened. As a result, the SFD diode is characterized by a high switching speed and low switching loss compared to the diode including only a pn-junction. The SFD diode enables the reverse recovery current to be reduced and the recovery time to be extended (soft recovery) and therefore, the SFD diode is characterized by applicability to an inverter, etc., and suppressed generation of noise (see, e.g., Nonpatent Literature 2).

Wide-gap semiconductor materials such as silicon carbide (SiC) have recently drawn attention as semiconductor materials suitable for high-withstand-voltage uses. For example, SiC has an excellent property of a high insulation-breakdown electric field intensity that is about 10 times as high as that of Si, and SiC realizes a high reverse-voltage blocking property. When a pn-junction diode is configured using SiC that is a bipolar semiconductor device, the diode realizes performance that is far more excellent compared to that of a pn-junction diode configured using Si. For example, when a pn-junction diode configured using SiC has a high withstand voltage of 10 kV or higher, the forward voltage of this diode is about a quarter or smaller and the reverse recovery time period corresponding to the speed obtained when the diode is turned off is about 10% or less, compared to those of a pn-junction diode configured using Si. Therefore, the pn-junction diode configured using SiC performs switching operation at high speeds and enables power loss to be reduced to about ⅙ or smaller than that of the pn-junction diode configured using Si. Therefore, wide-gap semiconductor materials such as SiC is expected to significantly contribute to energy saving (see, e.g., Nonpatent Literature 3).

An apparatus has been proposed as a semiconductor device configured using a wide-gap semiconductor material. In the apparatus, a junction formed by a drift layer and an anode layer, and a field limiting layer of a bipolar semiconductor device are formed isolated from each other, and an end of an anode electrode is disposed facing a semiconductor region between the junction and the field limiting layer through an insulating film. When a reverse bias is applied to the semiconductor device, the junction and the field limiting layer are electrically connected to each other due to an electric field effect given from the electrode through the insulating film to a drift layer between the junction and the field limiting layer, and concentration of the electric field is alleviated at an end of the junction. When a forward bias is applied thereto, the junction and the field limiting layer are also electrically isolated from each other and a forward current is caused to flow only through the junction (see, e.g., Patent Document 1).

An apparatus has been proposed as a semiconductor device having a Schottky barrier formed therein, including: a semiconductor substrate having a first surface and a second surface, a first conductivity type cathode region adjacent to the first surface, and a first conductivity type drift region on the cathode region; a cathode electrode in contact with the cathode region; a first trench disposed on the second surface, having a first side wall in the drift region, and having a mesa that is disposed between the first side wall and a second side wall and that has a predetermined mesa width and a predetermined mesa doping concentration; a second trench disposed on the second surface and having a second side wall in the drift region; a first insulating region on the first side wall and a second insulating region on the second side wall; an anode electrode disposed on the second surface and the first and the second insulating regions and forming a Schottky rectifying junction together with the mesa on the second surface, and the predetermined mesa doping concentration is higher than $1 \times 10^{16}$ dopant/cm$^3$ (see, e.g., Patent Document 2).

A 600-V-class low-withstand-voltage MPS diode has recently been proposed as depicted in FIG. 18, that uses SiC as a wide-gap semiconductor material, the properties of which are disclosed (see, e.g., Nonpatent Literature 4).

Patent Document 1: Japanese Laid-Open Patent Publication No. 2005-223220

Patent Document 2: Japanese Laid-Open Patent Publication No. 08-512430

Nonpatent Literature 1: The Institute of Electrical Engineers of Japan, "Power Device IC Handbook", 1st Edition, Corona Publishing Co., Ltd., Jul. 30, 1996, pp. 97-98

Nonpatent Literature 2: Mori, M., et al, "A NOVEL SOFT AND FAST RECOVERY DIODE (SFD) WITH THIN P-LAYER FORMED BY AL—SI ELECTRODE", (US), Proceedings of 3rd International Symposium on Power Semiconductor Devices and ICs, 1991, pp. 113-117

Nonpatent Literature 3: Sugawara, Yoshitaka, "SiC Power Devices for High-Power Conversion", Applied Physics, The Japan Society of Applied Physics, 2001, Vol. 70, No. 5, pp. 530-535

Nonpatent Literature 4: Alexandrov, P., et al, "4H—SiC MPS Diode Fabrication and Characterization in an Inductively Loaded Half-Bridge Inverter up to 100 kW", (Switzerland), ICSCRM '01: Proceedings of International Conference of Silicon Carbide and Related Materials 2001, Oct. 28 to Nov. 2, 2001, pp. 1177-1180

DISCLOSURE OF INVENTION

Problem to be Solved by the Invention

However, the techniques of Nonpatent Literatures 2 and 4 do not refer to any high-withstand-voltage diode configured using a wide-gap semiconductor material having a high withstand voltage; do not disclose any problem associated with enhancement of the withstand voltage nor any countermeasure thereagainst; and do not refer to the various problems in realizing high performance that a complex diode inherently has consequent to manufacturing process limitations caused by the difference between SiC used as the wide-gap semiconductor material and the conventional material of Si and limitations originating from the processing precision of current fabrication processes. These problems are serious problems especially in improving the performance of a high-performance high-withstand-voltage complex diode.

More specifically, the impurity diffusion speed of SiC used as the wide-gap semiconductor material is very low compared to that of Si and forming a pn-junction is difficult on a SiC substrate. Therefore, for the complex diodes as depicted in FIGS. 18 and 19, the p$^+$-regions 183 and 203 (hereinafter, each "pn-junction portion") are formed by ion implantation and each constitutes a pn-junction to conduct an energizing current (hereinafter, each "pn-main junction"). However, many faults occur in a pn-junction portion formed in the SiC substrate by ion implantation. Consequently, carriers are recombined and vanish in the faults generated in the pn-junction portion when a forward bias is applied and therefore, the forward voltage is increased. A large amount of leak current is generated due to the faults generated in the pn-junction portion when a reverse bias is applied. In a high-temperature and high-electric-field region that exerts the superiority of SiC, the leak current is further increased and therefore, a first problem arises that a high withstand voltage is difficult to realize.

The p$^+$-regions 183 and 203 functioning as anodes need increased impurity concentrations to increase carrier injection efficiency. Therefore, the dose needs to be increased for the ion implantation to form the p$^+$-regions 183 and 203 and the faults in the pn-junction portions become enormous. Due to the faults, excellent Schottky barriers and excellent shallow pn-junctions cannot be formed in the vicinity of the contact portion of the pn-main junction and, the Schottky barrier or the shallow pn-junction; and the withstand voltage property is degraded in both the forward direction and the reverse direction. In particular, for a high-withstand-voltage device having high electric fields applied to the Schottky barrier and the shallow pn-junction, a second problem arises in that the degradation of the withstand voltage property becomes conspicuous.

When wire bonding is applied to each of the anode electrodes (the Schottky contacts 184 and 205), a high mechanical stress (external force) is applied to the bonded portion of the anode electrode and a wire. Therefore, the n$^-$-drift layer 182 constituting the Schottky barrier (Schottky barrier portion) and the p$^+$-region 203 constituting the shallow pn-junction (shallow pn-junction portion) that are each disposed in the vicinity of the device surface of the anterior surface, are damaged and faults may be generated. Due to these faults, the electric properties are degraded in both the forward direction and the reverse direction. In particular, for a high-withstand-voltage device having high electric fields that hare applied to the Schottky barrier and pn-junction, a third problem arises in that the degradation of the withstand voltage property occurs conspicuously.

To solve the above problems related to the conventional techniques, an object of the present invention is to provide a semiconductor device having a high withstand voltage. Another object thereof is to provide a semiconductor device capable of avoiding the degradation of the withstand voltage property.

Means for Solving Problem

To solve the problems above and achieve an object, a semiconductor device according to the invention includes a first semiconductor region of a first conductivity type and formed of a material having a band gap wider than a band gap of silicon; a first layer selectively disposed on a surface of the first semiconductor region and forming a first junction with the first semiconductor region; a second layer selectively disposed on the surface of the first semiconductor region and forming a second junction with the first semiconductor region; a first diode formed by a region that includes the first junction; and a second diode formed by a region that includes the second junction. Further, a recess and an elevated portion that protrudes more than a bottom aspect of the recess are disposed on the surface of the first semiconductor region. The first junction and the second junction are formed at different depths from the surface of the first semiconductor region. A built-in potential of the second diode is lower than a built-in potential of the first diode.

In a semiconductor device according to the invention and based on the invention above, the first layer is disposed on a surface of the elevated portion, the second layer is disposed on the bottom aspect of the recess, and a depth of the first junction formed on the elevated portion from the surface of the elevated portion is shallower than a depth of the recess.

In a semiconductor device according to the invention and based on the invention above, an end of the first junction is exposed at a side face of the elevated portion.

In a semiconductor device according to the invention and based on the invention above, a thickness of the second layer is thinner than a thickness of the first layer.

In a semiconductor device according to the invention and based on the invention above, the first layer is a second semiconductor region of a second conductivity type, the second layer is a third semiconductor region of the second conductivity type, and the third semiconductor region is thinner than the second semiconductor region and has an impurity concentration that is lower than an impurity concentration of the second semiconductor region.

In a semiconductor device according to the invention and based on the invention above, the second semiconductor region is an epitaxial layer selectively disposed on the surface of the first semiconductor region, and the elevated portion is formed by the second semiconductor region.

In a semiconductor device according to the invention and based on the invention above, the first diode and the second diode are pn-junction diodes.

In a semiconductor device according to the invention and based on the invention above, the first layer is a second semiconductor region of a second conductivity type, and the second layer is a metal film that forms a Schottky barrier with the first semiconductor region.

In a semiconductor device according to the invention and based on the invention above, the second semiconductor region is an epitaxial layer selectively disposed on the surface of the first semiconductor region, and the elevated portion is formed by the second semiconductor region.

In a semiconductor device according to the invention and based on the invention above, the first diode is a pn-junction diode, and the second diode is a Schottky barrier diode.

In a semiconductor device according to the invention and based on the invention above, the elevated portion has a tapered shape, and a fourth semiconductor region of the second conductivity type contacts the first junction and the second junction, has an impurity concentration that is lower than an impurity concentration of the second semiconductor region, and is disposed in a surface layer on a side of the recess, between the first junction and the second junction.

In a semiconductor device according to the invention and based on the invention above, the recess is a trench formed in a surface that is of the first semiconductor region and where the second semiconductor region to be disposed, and a fourth semiconductor region of the second conductivity type contacts the first junction and the second junction, has an impurity concentration that is lower than an impurity concentration of the second semiconductor region, and is disposed in a surface layer of a side wall of the trench, between the first junction and the second junction.

In a semiconductor device according to the invention and based on the invention above, a fifth semiconductor region of a second conductivity type has an impurity concentration that is lower than an impurity concentration of the second semiconductor region and is disposed in a surface layer of a bottom aspect of the recess, and the second junction formed on the bottom aspect of the recess is divided by the fifth semiconductor region.

In a semiconductor device according to the invention and based on the invention above, the third semiconductor region is a region that is formed by ion implantation.

In a semiconductor device according to the invention and based on the invention above, the metal film is an alloy film that is formed by vapor-depositing a metal, followed by thermal treatment.

In a semiconductor device according to the invention and based on the invention above, the first semiconductor region is disposed on a semiconductor substrate that is of the first conductivity type and is formed of a material having a band gap wider than a band gap of silicon, a sixth semiconductor region that is thinner than the semiconductor substrate and has an impurity concentration that is higher than an impurity concentration of the semiconductor substrate is disposed inside the first semiconductor region, parallel to a surface of the semiconductor substrate, and the sixth semiconductor region is disposed deeper toward the semiconductor substrate than an intermediate depth in the first semiconductor region.

In a semiconductor device according to the invention and based on the invention above, the semiconductor device has a stripe-like planar layout formed by alternately and repeatedly disposing the first junction and the second junction, the first junction and the second junction are disposed in a stripe-like pattern, an end of the second junction is exposed at an outermost peripheral portion in a direction perpendicular to a longitudinal direction of the stripe, an end of the first junction and an end of the second junction are alternately exposed at an outermost peripheral portion in a direction parallel to the longitudinal direction of the stripe, and a field limiting layer disposed in the outermost peripheral portion and encompassing the first junction and the second junction contacts the end of the first junction and the end of the second junction that are exposed at the outermost peripheral portion.

According to the present invention, an MPS diode is fabricated using the epitaxial technique capable of significantly reducing the faults compared to the ion implantation technique. The MPS diode is characterized in that: a pn-main junction (the first junction) is formed by epitaxial-growing a $p^+$-layer (the second semiconductor region) on an n-layer (the first semiconductor region); and a Schottky barrier (the second junction) is formed on the n-layer from which the $p^+$-epitaxial layer is partially removed; otherwise, in manufacturing the MPS diode using the epitaxial technique, the n-layer is partially removed, the $p^+$-layer is epitaxial-grown to bury the n-layer to form the pn-main junction, and the Schottky barrier is formed on the n-layer not removed. Thereby, the MPS diode can be realized where defects are significantly reduced and the leak current is small even at a high temperature. In the outer peripheral portion of the diode, a field limiting region (such as JTE, FLR, or RESURF) is formed on the p-layer after the $p^+$-epitaxial layer is removed to contribute to realization of the high withstand voltage.

The pn-main junction and the Schottky barrier are disposed isolated from each other and, between these junctions, a p-fused field limiting layer (the fourth semiconductor region) that has concentration that is lower than that of the $p^+$-anode layer (the second semiconductor region), is formed by ion implantation. Both of the junctions are in contact with each other through the p-fused field limiting layer. The "fused field limiting layer" is a layer formed by fusing the field limiting layer of the pn-main junction and the field limiting layer of the Schottky barrier with each other, and has a function to simultaneously achieve the field limiting of both of the junctions. Thereby, direct contact of the pn-junction and the Schottky barrier can be avoided and the $p^+$-anode layer alone can be disposed at a high impurity concentration. On the other hand, a layer formed by implanting p-impurity to be in contact with the Schottky barrier is caused to function as the field limiting layer (the fifth semiconductor region) and therefore, the dose can be smaller than that of the $p^+$-anode layer. As a result, the faults generated by the ion implantation can be reduced and excellent forward and reverse properties can be realized accompanied by a small amount of leak current.

The p-fused field limiting layer alleviates excessive concentration of the electric field at the end of the Schottky barrier and realizes enhancement of the withstand voltage of the Schottky barrier portion. On the other hand, the p-fused field limiting layer can alleviate the concentration of the electric field at the end of the pn-main junction and simultaneously realizes enhancement the withstand voltage of the pn-main junction. To enhance the withstand voltages of both the pn-main junction and the Schottky barrier in a balanced manner, preferably, the impurity concentration of the p-fused field limiting layer is set to be in a range from $5 \times 10^{15}$ cm$^{-3}$ or higher to $1 \times 10^{18}$ cm$^{-3}$ or lower and, more preferably, in a range from $1 \times 10^{16}$ cm$^{-3}$ or higher to $8 \times 10^{17}$ cm$^{-3}$ or lower.

To solve the third problem, a first problem solving means is used. The Schottky barrier is formed at a position lower than that of the $p^+$-anode layer and therefore, a mechanical stress is directly applied to the upper portion of the $p^+$-anode layer when wire bonding is applied to the anode electrode. However, the stress is not directly applied to the Schottky barrier. Therefore, damage to the Schottky barrier can be prevented. On the other hand, when the n-layer is partially removed and the $p^+$-layer is epitaxial-grown thereon to bury the n-layer to form the pn-main junction, the $p^+$-layer is grown to be higher than the n-layer not removed. As a result, when wire bonding is applied, the mechanical stress is not directly applied to the Schottky barrier and the damage to the Schottky barrier can be prevented. The pn-junction portion is formed in the lower portion of the $p^+$-anode layer, i.e., the inside of the SiC substrate (semiconductor substrate) and the mechanical stress applied during the wire bonding is significantly alleviated. Thereby, damage to the pn-junction portion can be prevented. As a result, the generation of faults during the wire bonding in both of the junction portions can be suppressed and excellent forward and reverse properties can be realized.

As described, the faults generated by the ion implantation can be reduced. Therefore, degradation of the forward and reverse properties that is consequent to the faults, that is caused by expansion of the faults, and that occurs afterward during the operation, can be suppressed. Thereby, high reliability can be improved. In the case where the $p^+$-layer is partially removed by etching, that is formed by epitaxial-growth on the n-layer, when the n-layer is partially removed to form the $p^+$-layer, corners of a recess of the p-fused field limiting layer are over-etched and many protrusion-like trenches are formed therein. As a result, in a completed diode, the electric field excessively concentrates on the over-etched protrusion-like trenches when a reverse bias is applied, and the withstand voltage is reduced. The p-fused field limiting layer also alleviates the concentration of the electric field on the protrusion-like trenches. Therefore, the reduction of the withstand voltage of this kind is prevented and a high withstand voltage can be realized.

When the $p^+$-epitaxial layer is partially removed by etching to form the pn-main junction and when the n-layer is partially removed to form the $p^+$-layer, various kinds of crystal faults that originate from the etching are often formed on the surface left after the removal and in the corners of the recess. Stacking faults of these faults have an adverse action of capturing the carriers and causing them to vanish. The stacking faults easily expand due to the impacts generated when the minority carriers injected from the pn-main junction collide with the crystal lattice of the portion having stacking faults. As a result, the region to capture the carriers and cause them to vanish is expanded and the forward voltage is increased. Therefore, not only the stationary loss is increased but also the device may be broken. The p-fused field limiting layer suppresses the collision of the carriers injected with stacking faults around the etched surface and those around the corner surfaces. Therefore, the increase of the stationary loss and the device breakage can be suppressed.

The diode is characterized in that one or more p-layer(s) (the fifth semiconductor region(s)) of a concentration in the above concentration range is (are) disposed in the Schottky barrier portion. Thereby, in the case where a reverse bias is applied, the n-layer sandwiched by p-layers under the Schottky barrier portion is pinched off by a depletion layer spreading from a junction formed by the p-layer and the n-layer when a reverse voltage is applied that is a predetermined reverse voltage or higher, and any increase of the electric field intensity in the Schottky barrier portion can be suppressed when any reverse voltage is applied that is equal to higher than the above voltage. When the width, that is, the area of the entire Schottky barrier portion is set to be substantially uniform, an ultra high withstand voltage can be realized compared to that of the conventional semiconductor device. When the withstand voltage is set to substantially be equal to that of the conventional semiconductor devices, the area of the Schottky barrier portion can be increased compared to the conventional semiconductor device. As a result, the time period can be further shortened for the remaining carriers in the drift layer to vanish when the switching is turned off and therefore, the switching speed can be further increased and, as a result, reduction of the loss can be facilitated.

The diode is characterized in that an ohmic contact metal film and an electrode film are formed on and in direct contact with slopes on both sides of an elevated portion that has the $p^+$-anode layer disposed therein. As a result, a lift-off process for the ohmic contact metal film can be omitted. Therefore, the manufacturing processes can be simplified and improvement of each of the yield and the economical efficiency can be facilitated. In addition, the p-fused field limiting layer also functions to some extent as a carrier injecting layer when a forward voltage is applied and an on-voltage can be reduced.

The diode is characterized in that the material of the ohmic contact metal film of the pn-junction and that of the Schottky barrier metal are different from each other. This enables reduction of contact resistance and improvement of the Schottky barrier to be independently executed and independent selection of the optimal material for each of these. For example, using titanium (Ti) as the ohmic contact film of the $p^+$-layer and nickel (Ni) as the Schottky barrier metal enables improvement of the properties of the semiconductor device. In this case, a somewhat thick gold (Au) or aluminum (Al) film is disposed on an electrode film including Ti and Ni, whereby, the films are connected and the resistance of the anode electrode is reduced and thus, the loss is reduced.

Both ends of the anode region, which has the pn-main junctions and the Schottky barriers alternately disposed therein, are each configured to form a Schottky barrier, and the end of the Schottky barrier is overlapped with and contacts the field limiting region (such as the JTE, FLR, or RESURF) disposed on the n-layer in the outer peripheral portion. Thus, the discharge time period of the remaining carriers has no deviation in the $n^-$-drift layer under all the pn-main junctions in the anode region when the switching is turned off, and the reverse recovery time period can be shortened and the switching loss can be reduced. When both ends of the anode region are disposed to form the pn-main junctions, the discharge time period of the remaining carriers in the $n^-$-drift layer under the pn-main junctions at the ends becomes longer than the discharge time period of the remaining carriers in the $n^-$-drift layer under the other pn-main junctions inside the anode region. Therefore, the reverse recovery time period becomes long and the switching loss is further increased.

Effect of the Invention

According to the semiconductor device according to the present invention, an effect is achieved that a high withstand voltage semiconductor device can be provided. Another effect is achieved that a semiconductor device can be provided that is capable of avoiding degradation of the withstand voltage property. As described, the present invention can provide a wide-gap MPS diode having few self-contained faults, can realize improved performance such as a higher withstand voltage, a lower loss, and a higher speed, and can improve reliability.

BEST MODE(S) FOR CARRYING OUT THE INVENTION

With reference to the accompanying drawings, preferred embodiments of a semiconductor device and fabrication method of the semiconductor device according to the invention will be described in detail. In the specification and the accompanying drawings, a layer or a region written with "n" or "p" at the head means that electrons or positive holes are the majority carriers therein. "+" and "−" attached to "n" or "p" means that the impurity concentration is higher and lower than that of a layer or region not attached therewith. In description of embodiments as follows and the accompanying drawings, same configurations are given the same numerals and will not again be described.

First Embodiment

Figure 1:
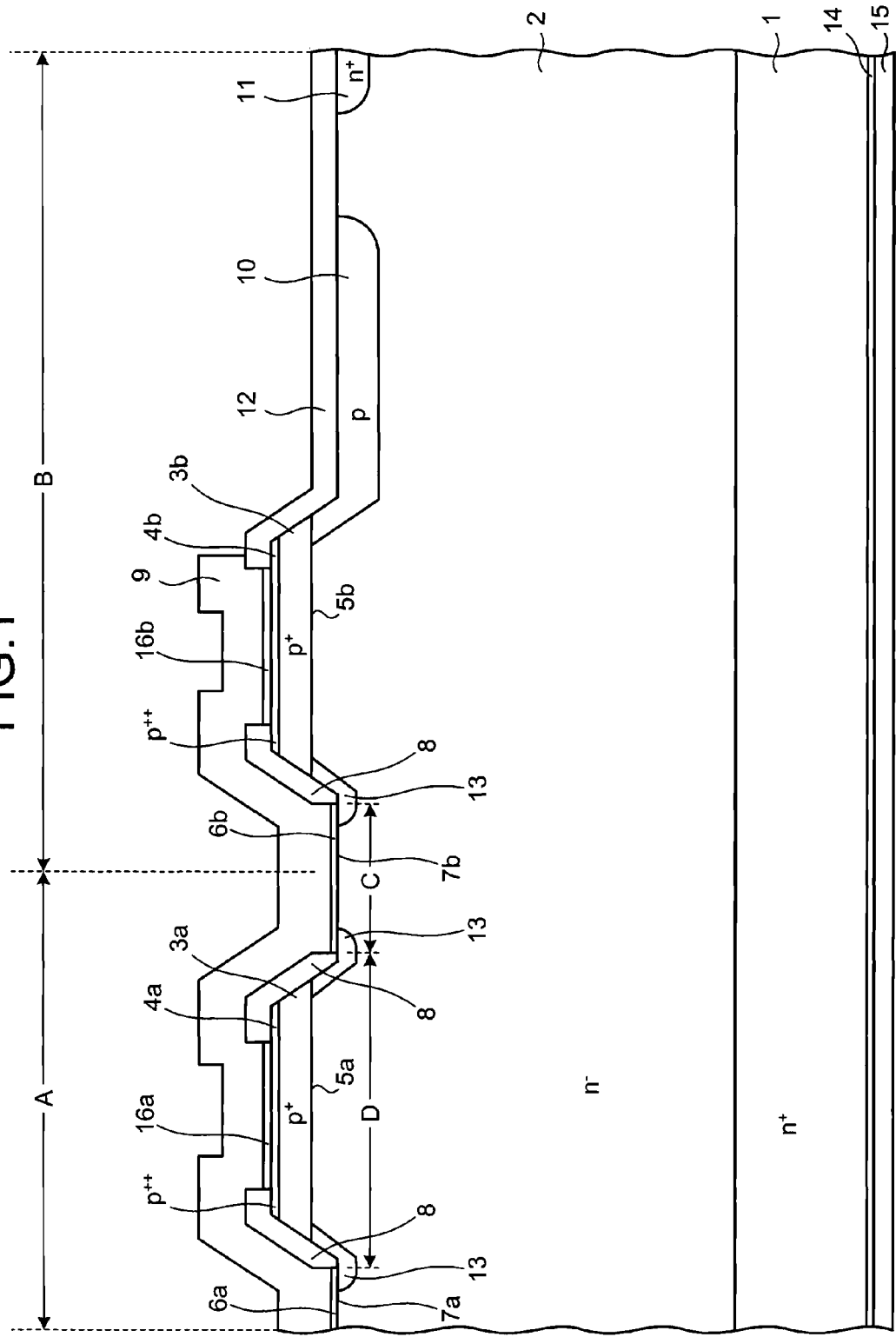
FIG. 1 is a cross-sectional diagram depicting an overview of an MPS diode according to a first embodiment.

FIG. 1 is a cross-sectional diagram depicting an overview of an MPS diode according to a first embodiment. The MPS diode depicted in FIG. 1 is, for example, a high withstand voltage wide-gap semiconductor diode having a withstand voltage of a 16-kV class. In the MPS diode depicted in FIG. 1, an $n^-$-drift layer (a first semiconductor region) 2 is disposed on the surface of the anterior surface of an $n^+$-cathode substrate 1. The $n^+$-cathode substrate 1 is made of a material having a band gap that is wider than that of silicon (a wide-gap semiconductor) such as, for example, a four-layer-cycle hexagonal crystal of silicon carbide (4H—SiC). The impurity concentration and the thickness of the $n^+$-cathode substrate 1 may respectively be $2\times10^{19}$ cm$^{-3}$ and 400 μm. The impurity concentration and the thickness of the $n^-$-drift layer 2 may respectively be $4.5\times10^{14}$ cm$^{-3}$ and 170 μm. The $n^-$-drift layer 2 is formed using, for example, an epitaxial growth method.

On the surface of the $n^-$-drift layer 2, $p^+$-anode layers (first layers, second semiconductor regions) 3a and 3b are disposed away from each other. Multiple $p^+$-anode layers 3a are disposed. The $p^+$-anode layers 3a are each disposed away from each other and side by side. More specifically, when the n$^+$-cathode substrate 1 is cut into individual chips, the p$^+$-anode layers 3b are each disposed on the outer peripheral portion and the p$^+$-anode layers 3a are disposed at positions closer to the chip center than the p$^+$-anode layers 3b (see FIG. 2).

The impurity concentration and the thickness of the p$^+$-anode layers 3a and 3b may respectively be $5 \times 10^{18}$ cm$^{-3}$ and 1.7 μm. P$^{++}$-contact layers 4a and 4b are respectively disposed on the surfaces of the p$^+$-anode layers 3a and 3b. The impurity concentration and the thickness of the p$^{++}$-contact layers 4a and 4b may respectively be $2 \times 10^{19}$ cm$^{-3}$ and 0.2 μm. On the surface of the n$^-$-drift layer 2, pn-junctions (pn-main junctions, first junctions) 5a and 5b formed by the p$^+$-anode layers 3a or 3b, and the N$^-$-drift layer 2 are formed. Pn-junction diodes (first diodes) are disposed that are formed by regions including the pn-main junctions 5a and 5b. The regions including the pn-main junctions 5a and 5b are regions that include each at least the n$^+$-cathode substrate 1, the n$^-$-drift layer 2, and the p$^+$-anode layers 3a or 3b.

The p$^+$-anode layers 3a and 3b, and the p$^{++}$-contact layers 4a and 4b are sequentially formed using the epitaxial growth method. The P$^+$-anode layers 3a and 3b, and the p$^{++}$-contact layers 4a and 4b are processed into mesa-like shapes using an RIE (Reactive Ion Etching) technique. Hereinafter, the mesa-like portions will each be referred to as a "mesa portion" that is formed between the p$^+$-anode layers 3a, and between the p$^+$-anode layer 3a and the p$^+$-anode layer 3b. The p$^+$-anode layer 3a is disposed between the mesa portions, which are disposed adjacently. The height may be about 2.5 μm from the surface of the n$^-$-drift layer 2 exposed in the bottom aspect of the mesa portion (hereinafter, "mesa bottom", a recess) to the surface of the p$^{++}$-contact layers 4a and 4b (hereinafter, "mesa height").

A Ti (a second layer) film 6a is disposed as a metal film for a Schottky barrier (hereinafter, "Schottky barrier metal") on the mesa bottom between the p$^+$-anode layers 3a disposed side by side, whereby a Schottky barrier (a second junction) 7a is formed. A Ti (titanium) film 6b is disposed as a Schottky barrier metal on the mesa bottom between the p$^+$-anode layer 3a and the p$^+$-anode layer 3b and, thereby, a Schottky barrier 7b is formed. Schottky barrier diodes (second diodes) are disposed that are formed by regions including the Schottky barriers 7a and 7b. The regions including the Schottky barriers 7a and 7b are regions including each at least the n$^+$-cathode substrate 1, the n$^-$-drift layer 2, and the Ti films 6a or 6b. The built-in potential of the Schottky barrier diode is lower than the built-in potential of the pn-junction diode.

A width C of the mesa bottom having the Schottky barriers 7a and 7b formed thereon, may be about 40 μm. An interval D from a corner of the mesa bottom to a corner of an adjacent mesa bottom (hereinafter, "mesa bottom interval", an elevated portion), may be about 60 μm. Ti films 16a and 16b are respectively disposed on the p$^+$-contact layers 4a and 4b as ohmic contact metal films (hereinafter, each "ohmic contact metal") for the anode. The Ti films 6a, 6b, 16a, and 16b are formed in the same vapor deposition process and the same photolithography process.

More specifically, the pn-main junctions 5a and 5b, and the Schottky barriers 7a and 7b are formed as follows. A p$^+$-epitaxial layer and a p$^{++}$-epitaxial layer are sequentially stacked on the surface of the n$^-$-drift layer 2 stacked on the anterior surface of the n$^+$-cathode substrate 1. The p$^+$-epitaxial layer constitutes the p$^+$-anode layers 3a and 3b in a process executed later and the p$^{++}$-epitaxial layer constitutes the p$^{++}$-contact layers 4a and 4b.

The p$^+$-epitaxial layer and the p$^{++}$-epitaxial layer stacked on the surface of the n$^-$-drift layer 2 are selectively etched to be removed to a depth reaching the n$^-$-drift layer 2. In this etching, a portion of the surface layer of the n$^-$-drift layer 2 may be removed together with the p$^+$-epitaxial layer and the p$^{++}$-epitaxial layer. Thereby, the mesa portion is formed. The p$^+$-epitaxial layer and the p$^{++}$-epitaxial layer are divided into the multiple p$^+$-anode layers 3a and $p^{++}$-contact layers 4a, and the p$^+$-anode layer 3b and the p$^{++}$-contact layer 4b to form the pn-main junctions 5a and 5b.

A Ti film is vapor-deposited on the entire anterior surface of the n$^+$-cathode substrate 1. The Ti film is selectively removed using photolithography for the Ti film stacked on the surface of the p$^{++}$-contact layers 4a and 4b and on the mesa bottoms to remain. Thereby, the Ti films 6a and 6b, which are to be ohmic contacts, are formed on the surfaces of the p$^{++}$-contact layers 4a and 4b. The Ti films 16a and 16b are formed as a Schottky metal on the mesa bottoms to form the Schottky barriers 7a and 7b. By the above processes, the pn-main junctions 5a and 5b and the Schottky barriers 7a and 7b are formed on the anterior surface of the n$^+$-cathode substrate 1 as follows.

In the method of forming the pn-main junctions 5a and 5b and the Schottky barriers 7a and 7b: recesses may be formed on the surface on the reverse side opposite to the surface in contact with the p$^+$-cathode substrate 1; thereafter, the p$^+$-epitaxial layer and the p$^{++}$-epitaxial layer may be grown in these recesses; and the pn-main junctions 5a and 5b may be formed on the bottom of the recesses. In this case, the Ti films 16a and 16b are formed as the Schottky metal on the surface that has no recess formed thereon and is of the n$^-$-drift layer 2, on the reverse side opposite to the surface in contact with the n$^+$-cathode substrate 1, to form the Schottky barriers 7a and 7b.

P-fused field limiting layers 13 (fourth semiconductor regions) are formed by ion implantation in the surface layer of the n$^-$-drift layer 2 exposed between the pn-main junction 5a and the Schottky barrier 7a and between the pn-main junctions 5a and 5b, and the Schottky barrier 7b. The p-fused field limiting layers 13 may, for example, be formed after forming the p$^+$-anode layers 3a and 3b and the p$^{++}$-contact layers 4a and 4b by removing the p$^+$-epitaxial layer and the p$^{++}$-epitaxial layer. The impurity concentration and the width of the p-fused field limiting layer 13 may respectively be about $8 \times 10^{16}$ cm$^{-3}$ and about 5 μm. The "width of the p-fused field limiting layer 13" is the length in parallel to the anterior surface of the n$^+$-cathode substrate 1 from an end of the mesa bottom.

An anode electrode film 9 is formed through insulating protective films 8 disposed on the walls of the mesas on the anterior surface of the n$^+$-cathode substrate 1. The anode electrode film 9 is in contact with the Ti films 6a, 6b, 16a, and 16b. The anode electrode film 9 is made of, for example, Au (gold). The thickness of the anode electrode film 9 may be about 3.5 μm. The insulating protective films 8 disposed on the side walls of the mesas cover a portion of an end of each of the p$^+$-anode layers 3a and 3b, an end of each of the p$^{++}$-contact layers 4a and 4b, and the p-fused field limiting layers 13 that are exposed at the mesa portions.

A region that spans from the central portion of the mesa portion to the central portion of the adjacent mesa portion is a complex unit "A". The complex unit A includes a region having the pn-main junction 5a formed therein and spans between the central portions of the mesa portions adjacent to the region having the pn-main junction 5a (see FIG. 2).

When the n$^+$-cathode substrate 1 is cut into individual chips, a region that spans from the central portion of the mesa portion having the Schottky barrier 7b formed therein to the outermost peripheral portion of the chip, is an outermost peripheral portion B. The outermost peripheral portion B is a region that includes the pn-main junction 5b formed in the outermost peripheral portion of the chip. The p+-epitaxial layer and the p++-epitaxial layer stacked to form the p+-anode layer 3b and the p++-contact layers 4b on the surface of the n−-drift layer 2 positioned at a peripheral portion of the chip farther out than the region including the pn-main junction 5b are removed with the formation of the mesa portions, and the n−-drift layer 2 is exposed. In the surface layer of the exposed surface of the n−-drift layer 2, a JTE (Junction Termination Extension) 10, which is to be the field limiting layer, and a channel stopper 11 are formed by ion implantation. The JTE 10 and the channel stopper 11 are disposed away from each other.

The JTE 10 and the channel stopper 11 encompass the complex units A disposed in the central portion of the chip. The JTE 10 is in contact with the pn-main junction 5b that is formed in the outermost portion. The JTE 10 and the channel stopper 11 are covered by a passivation film 12 formed by stacking multiple insulating films including an $SiO_2$ film. The passivation film 12 covers ends of the p+-anode layer 3b and the p++-contact layer 4b exposed in the outermost portion.

The impurity concentration, the width, and the depth of the JTE 10 may respectively be about $2.5×10^{17}$ $cm^{−3}$, 500 μm, and 1.2 μm. The impurity concentration of the channel stopper 11 may be about $5×10^{18}$ $cm^{−3}$. An Ni ohmic contact 14 and a cathode electrode film 15 are formed on the posterior surface of the n+-cathode substrate 1. The cathode electrode film 15 includes Au as a main component.

Figure 2:
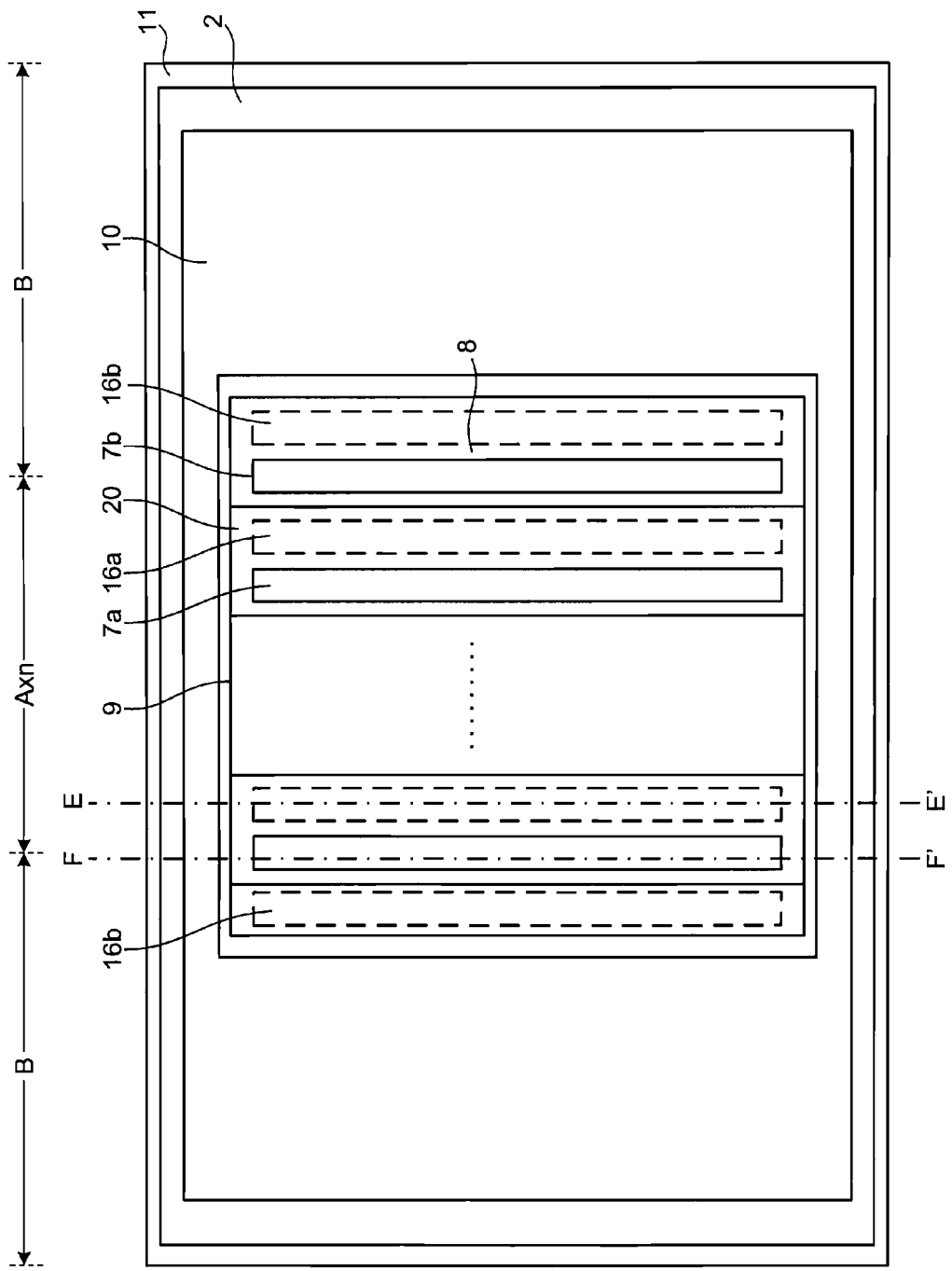
FIG. 2 is a plan view depicting an overview of the MPS diode according to the first embodiment.

FIG. 2 is a plan view depicting an overview of the MPS diode according to the first embodiment. FIG. 2 depicts a planar layout of the complex units A and the outermost peripheral portions B formed on the chip. Though an actual chip is square, the aspect ratio of the chip depicted is varied to about 1:5 to clearly show the planar layout of the MPS diode. The Ti films 16a and 16b depicted by rectangles of coarse dotted lines and the Schottky barriers 7a and 7b depicted by rectangles of solid lines are handled as one unit 20 and, for example, 30 units 20 are arranged side by side. "Axn" in FIG. 2 means that multiple units 20 are arranged.

For example, the complex unit A depicted in FIG. 1 may be a region spanning from the central portion of the Schottky barrier 7a in a given unit 20 to the central portion of the Schottky barrier 7b in another unit 20 adjacent to the Ti film 16a in the given unit 20 including the Ti film 16a in the given unit 20. The complex unit A may be a region spanning from the central portion of the Schottky barrier 7a in a given unit 20 to the central portion of the Schottky barrier 7b in another unit 20 adjacent to the Ti film 16a in the given unit 20 including the Ti film 16b in the given unit 20. For example, the complex units A may be disposed such that the Ti film 16a and the Ti film 16b are alternately repeated respectively on adjacently disposed mesa portions.

The outermost peripheral portion B depicted in FIG. 1 may be a region spanning from the central portion of the Schottky barrier 7b in a given unit 20 disposed in the outmost portion to the channel stopper 11 in the outermost peripheral portion of the chip. Among the 30 units 20 (hereinafter, "complex unit group"), units 20 in the vicinity of the central portion of the chip are not depicted and are indicated by a thick fine-dotted line. The length is, for example, 3 mm of the unit 20 in the direction for the units 20 to be arranged.

The JTE 10 encompasses the complex unit group. The channel stopper 11 encompasses the JTE 10 and the complex unit group. The chip may be, for example, a square shape of a length of 4 mm. The chip is configured: to have the n−-drift layer 2 and the p+-anode layers 3a and 3b constituting the pn-junctions 5a and 5b and exposed at the ends of the Ti film 16a and 16b (an upper and a lower ends of a cutting plane line E-E') in the unit 20 in a direction perpendicular to the direction for the units 20 to be arranged; and to have the pn-junctions 5a and 5b (see FIG. 1) connected to the JTE 10. The chip is also configured to have the Schottky barriers 7a and 7b connected to the JTE 10 for the Schottky barriers 7a and 7b (the upper and the lower ends of a cutting plane line F-F') in the unit 20 in a direction perpendicular to the direction for the units 20 to be arranged.

In the first embodiment, the Schottky barriers 7a and 7b can be formed at positions lower than those of the pn-main junctions 5a and 5b. Therefore, when the switching operation is turned off, a distance to the accumulated carriers remaining in the n−-drift layer 2 immediately under the pn-main junctions 5a and 5b, can be easily shortened. As a result, the accumulated carriers can be more quickly and efficiently discharged through the Schottky barriers 7a and 7b, which have built-in voltages that are lower than those of the pn-main junctions 5a and 5b. Therefore, the accumulated carrier vanishing time period can be shortened, the switching speed can be increased, the switching loss can be reduced, and the reverse recovery current can be reduced.

First Example

An operation and representative properties of the MPS diode according to the first embodiment will be described following an operation executed during an operation test of the MPS diode according to the first embodiment fabricated as a first example. The MPS diode according to the first example was fabricated and implemented as follows. The diode was bonded as a die onto a TO (pin-insertion) package. Multiple Au wires for wiring were wire-bonded on the anode electrode film 9 made of Au. The diameter of the Au wire was 100 μm. The entire chip and the majority of the Au wires were covered by nano-technology resin that was a highly heat-resistant resin to protect the diode, to manufacture a semiconductor device. An operation test was executed for the MPS diode according to the first sample.

In the MPS diode according to the first sample, a voltage was applied between the anode electrode film 9 and the cathode electrode film 15 such that a state was established where the potential of the anode electrode film 9 was higher than the potential of the cathode electrode film 15, i.e., a "forward direction state". When the voltage applied was increased to about 0.6 to 0.7 V, a forward current started to flow consequent to the Schottky barriers 7a and 7b being biased in the forward direction. When the voltage applied was further increased to about 2.7 V, the forward current started to rapidly increase consequent to the pn-main junctions 5a and 5b being biased in the forward direction and injection of the minority carriers starting, whereby the conductivity of the n−-drift layer 2 was varied and the internal resistance was reduced. The average forward current density of the MPS diode according to the first example was about 40 $A/cm^2$ at room temperature and with a forward voltage of 5 V, and was equal to that of a Si diode having a withstand voltage of a 5-kV class even though the withstand voltage of the sample was high. Thus, the MPS diode according to the first example: had an electric property at a level at which the diode was sufficiently usable in practice, similarly to the conventional Si diode; and configurable to have a higher withstand voltage than that of the conventional Si diode.

In the MPS diode according to the first sample, a voltage was applied between the anode electrode film 9 and the cathode electrode film 15 such that a state was established where the potential of the anode electrode film 9 was lower than the potential of the cathode electrode film 15, i.e., a "reverse direction state". A leak current tended to increase as the voltage applied increased. The withstand voltage current density of a leak current of the MPS diode according to the first sample showed a low value of $3\times10^{-3}$ A/cm$^2$ or less at room temperature and $4\times10^{-2}$ A/cm$^2$ or less at a high temperature of 250° C. even though the voltage applied was 16 kV and the diode showed excellent electric properties. The withstand voltage indicating an avalanche breakdown was 18 kV or higher at room temperature and the diode also showed an excellent electric property.

For comparison, a semiconductor device was fabricated that did not have any p-fused field limiting layers 13 disposed between the pn-main junctions 5a and 5b, and the Schottky barriers 7a and 7b (hereinafter, "first comparative example"), and a same operation test was executed for the first comparative example as that for the MPS diode according to the first example. The other configurations of the first comparative example were same as those of the MPS diode according to the first example. The forward withstand voltage of the first comparative example was about 5.2 kV. Another semiconductor device was fabricated that had: instead of the p-fused field limiting layers 13, the Schottky barriers disposed away from the corners of the mesa bottoms; and only guard rings disposed therein (hereinafter, "second comparative example") and a same operation test was executed for the second comparative example as that for the MPS diode according to the first example. The other configurations of the second comparative example were same as those of the MPS diode according to the first example. The forward withstand voltage of the second comparative example was about 6.8 kV. Thus, disposing the p-fused field limiting layers 13 enabled the leak current of the high-withstand-voltage semiconductor device to be reduced and the withstand voltage to increase.

The reverse recovery time period of the MPS diode according to the first example was 26 ns when a forward current having the forward current density of about 40 A/cm$^2$ was turned off after the current was caused to flow therein. The reverse recovery current density thereof was low that was about 54 A/cm$^2$. The diode showed excellent electric properties. The testing conditions in this case were room temperature, 6.5 kV as the reverse voltage applied, and 7 kA/cm$^2$/μs as the reduction rate of the current density dj/dt. For comparison, a pn-diode was fabricated that had no Schottky barriers 7a and 7b formed therein and had only the pn-main junctions 5a and 5b (hereinafter, "third comparative example") and the reverse recovery time period and the reverse recovery current density thereof were measured under the same conditions as those of the MPS diode according to the first example. The other configurations of the third comparative example were same as those of the MPS diode according to the first example. The reverse recovery time period of the third comparative example was 57 ns. The reverse recovery current density of the third comparative example was about 165 A/cm$^2$ and was high compared to that of the MPS diode according to the first example. Thus, the leak current of the MPS diode according to the first example was able to be reduced to a value lower than that of the third comparative example.

In the MPS diode according to the first example, the width C of the mesa bottoms having the Schottky barriers 7a and 7b formed thereon was set to be about 40 μm and the interval D between the mesa bottoms was set to be about 60 μm. However, the width C and the interval D may be varied. The width C of the mesa bottom and the interval D between the mesa bottoms may be varied without varying a width (C+D) acquired by totaling the width C of the mesa bottom and the interval D between the bottoms. Thereby, a trade-off relation between the on-voltage and the reverse recovery time period becomes changeable.

More specifically, an increase of the width C of the mesa bottoms having the Schottky barriers 7a and 7b formed thereon and reduction of the interval D between the mesa bottoms having the pn-main junctions 5a and 5b formed thereon cause the on-voltage to somewhat increase while the increase and the reduction can shorten the reveres recovery time period. On the other hand, reduction of the width C of the mesa bottom and an increase of the interval D between the mesa bottoms cause the reverse recovery time period to be extended while this reduction and this increase can reduce the on-voltage. For example, when the width C of the mesa bottom was set to be 60 μm, the interval D between the mesa bottoms was set to be 40 μm, and the diode was energized at room temperature and with the forward current density of about 40 A/cm$^2$, the on-voltage was increased to 5.6 V and the reverse recovery time period was able to be reduced to 19 ns.

When the wire-bonding using Au was applied to the anode electrode film 9, a mechanical stress applied to the bonded portion of the anode electrode film 9 and the Au wire (hereinafter, "external force applied to the anode electrode film 9") is applied to the upper portions of the p$^+$-anode layers 3a and 3b that are in contact with the anode electrode film 9. The pn-junctions 5a and 5b are formed beneath the p$^+$-anode layers 3a and 3b and therefore, the stress applied to the regions in the vicinity of the pn-junctions 5a and 5b is alleviated by an amount corresponding to the thickness of the p$^+$-anode layers 3a and 3b. Therefore, damage is reduced to the portions of p$^+$-anode layers 3a and 3b (pn-junction portions) that constitute the pn-main junctions 5a and 5b. The Schottky barriers 7a and 7b are formed on the mesa bottoms and therefore, the external force applied to the anode electrode film 9 during the wire-bonding is not directly applied to the region in the vicinity of the Schottky barriers 7a and 7b. Therefore, damage to the n$^-$-drift layer 2 constituting the Schottky barriers 7a and 7b (Schottky barrier portions) can be prevented.

Generation of faults during the wire-bonding can be suppressed in the pn-junction portions and the Schottky barrier portions as described and therefore, various excellent properties are can be realized in the forward direction and the reverse direction. Faults generated in the pn-junction portions and the Schottky barrier portions are reduced and therefore, damage tends not to be expanded from the faults during the operation, and degradation of the withstand voltage property can be suppressed in the forward direction and the reverse direction. Thereby, a highly reliable and high-withstand-voltage MPS diode can be realized.

More specifically, a reverse voltage application test at a high temperature of 200° C. with an applied voltage of 16 kV and an energization test with a forward current density of 40 A/cm$^2$ were executed each for about 1,000 hours for the MPS diode according to the first example. No conspicuous degradation was discovered for any property of the MPS diode according to the first example. An increase of the forward voltage originating from stacking faults tends to be reduced when the temperature of the diode is increased and the increase tends to be reproduced when the temperature of the diode is returned to the original temperature. In the reverse voltage application test and the energization test, no such increase of the forward voltage was observed regardless of the temperature condition. Therefore, it is presumed that at least the increase of the forward voltage originating from the stacking faults generated by the damage to the p$^+$-anode layers 3a and 3b caused during the RIE etching of the p$^+$-epitaxial layer to be the p$^+$-anode layers 3a and 3b was suppressed by the p-fused field limiting layers 13.

As described, according to the first embodiment, the p$^+$-epitaxial layer to be the p$^+$-anode layers 3a and 3b is stacked on the surface of the n$^-$-drift layer 2 and the pn-main junctions 5a and 5b are formed that are configured by the n$^-$-drift layer 2 and the p$^+$-epitaxial layer. Therefore, the pn-main junctions 5a and 5b can be formed on the SiC substrate without using any ion implantation. Thereby, no fault is generated in the p$^+$-anode layers 3a and 3b by ion implantation. Therefore, generation of leak current that originates from the faults formed in the p$^+$-anode layers 3a and 3b due to ion implantation, can be prevented. Therefore, a high-withstand-voltage MPS diode can be provided.

The Schottky barriers 7a and 7b are formed on the mesa bottoms by forming the pn-main junctions 5a and 5b by processing the p$^+$-anode layers 3a and 3b into mesa-like shapes. Thereby, the pn-main junctions 5a and 5b, and the Schottky barriers 7a and 7b are not in contact with each other. Therefore, even when, to increase the carrier injection efficiency, the impurity concentration is increased of the p$^+$-anode layers 3a and 3b that function as the anodes, excellent Schottky barriers 7a and 7b having leak currents that are small can be formed. Thereby, the leak currents can be reduced and degradation of the withstand voltage property can be prevented in both the forward direction and the reverse direction.

The pn-main junctions 5a and 5b are formed beneath the p$^+$-anode layers 3a and 3b. Therefore, the stress applied to the pn-junction portions are alleviated by an amount corresponding to the thickness of the p$^+$-anode layers 3a and 3b. Thereby, damage to the pn-junction portions can be reduced. Forming the Schottky barriers 7a and 7b on the mesa bottoms avoids application to the Schottky barrier portions of the external force applied to the anode electrode film 9 during the wire-bonding. Thereby, damage to the Schottky barrier portions can be prevented. Therefore, faults tend not to be generated in the pn-junction portions and the Schottky barrier portions, leak currents can be reduced, and degradation of the withstand voltage property can be prevented in both the forward direction and the reverse direction.

Second Embodiment

Figure 3:
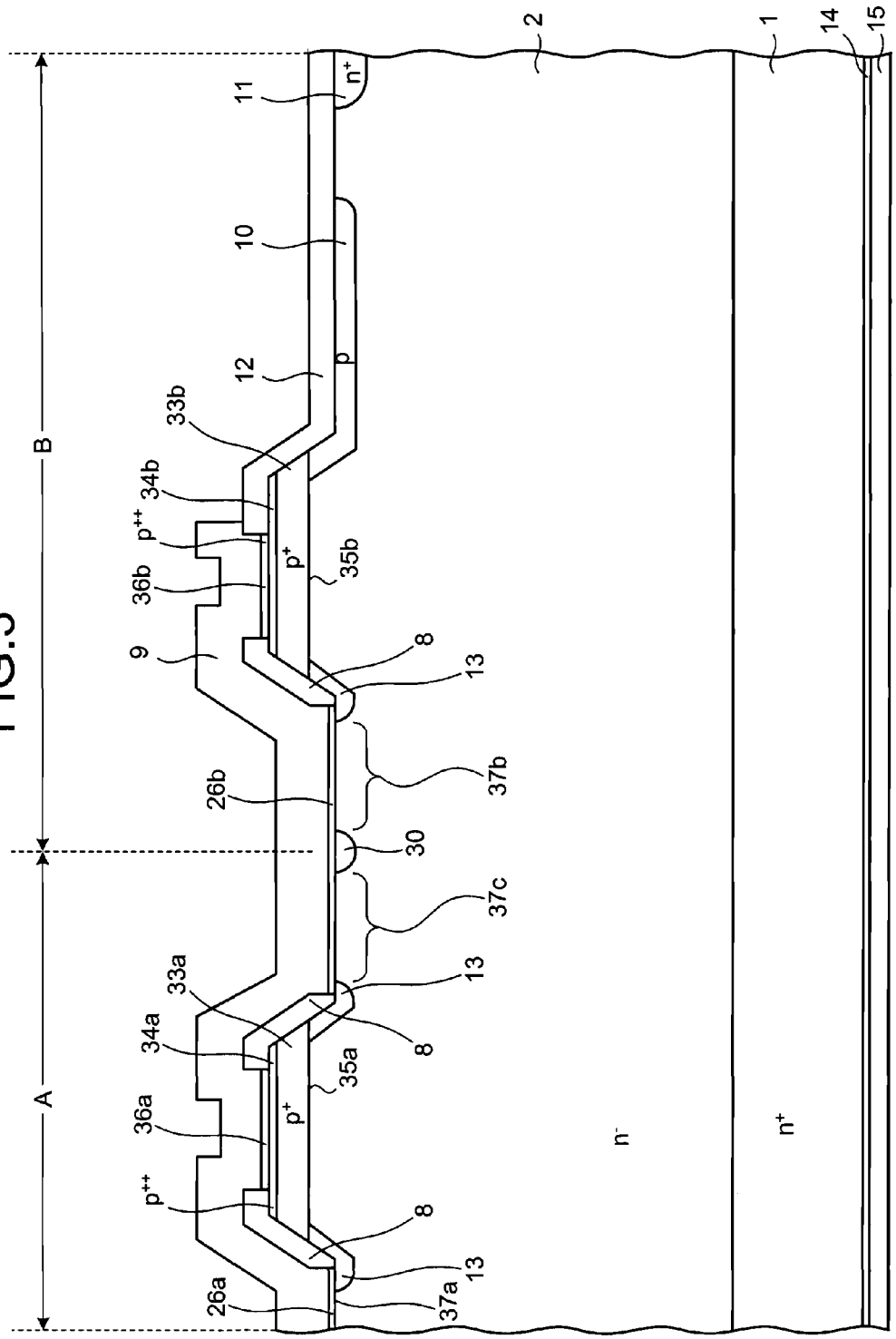
FIG. 3 is a cross-sectional diagram depicting an overview of an MPS diode according to a second embodiment.

FIG. 3 is a cross-sectional diagram depicting an overview of the MPS diode according to a second embodiment. The MPS diode depicted in FIG. 3 is, for example, a high withstand voltage MPS diode having a withstand voltage of a 13-kV class. The MPS diode according to the second embodiment is configured differently from the MPS diode according to the first embodiment in the following two items.

(1) The width of the Schottky barrier formed on the mesa bottom between pn-main junctions 35a, and the width of the Schottky barrier formed on the mesa bottom between a pn-main junction 35a and a pn-main junction 35b are increased to be wider than the widths of the Schottky barriers 7a and 7b of the first embodiment. A pinch-off p-layer 30 (a fifth semiconductor region) is disposed in the central portion of the Schottky barrier. (2) The manufacturing process of the semiconductor device is simplified by forming the JTE 10 to be the field limiting region in the same ion implantation process as that for the p-fused field limiting layers 13 (not depicted).

Figure 18:
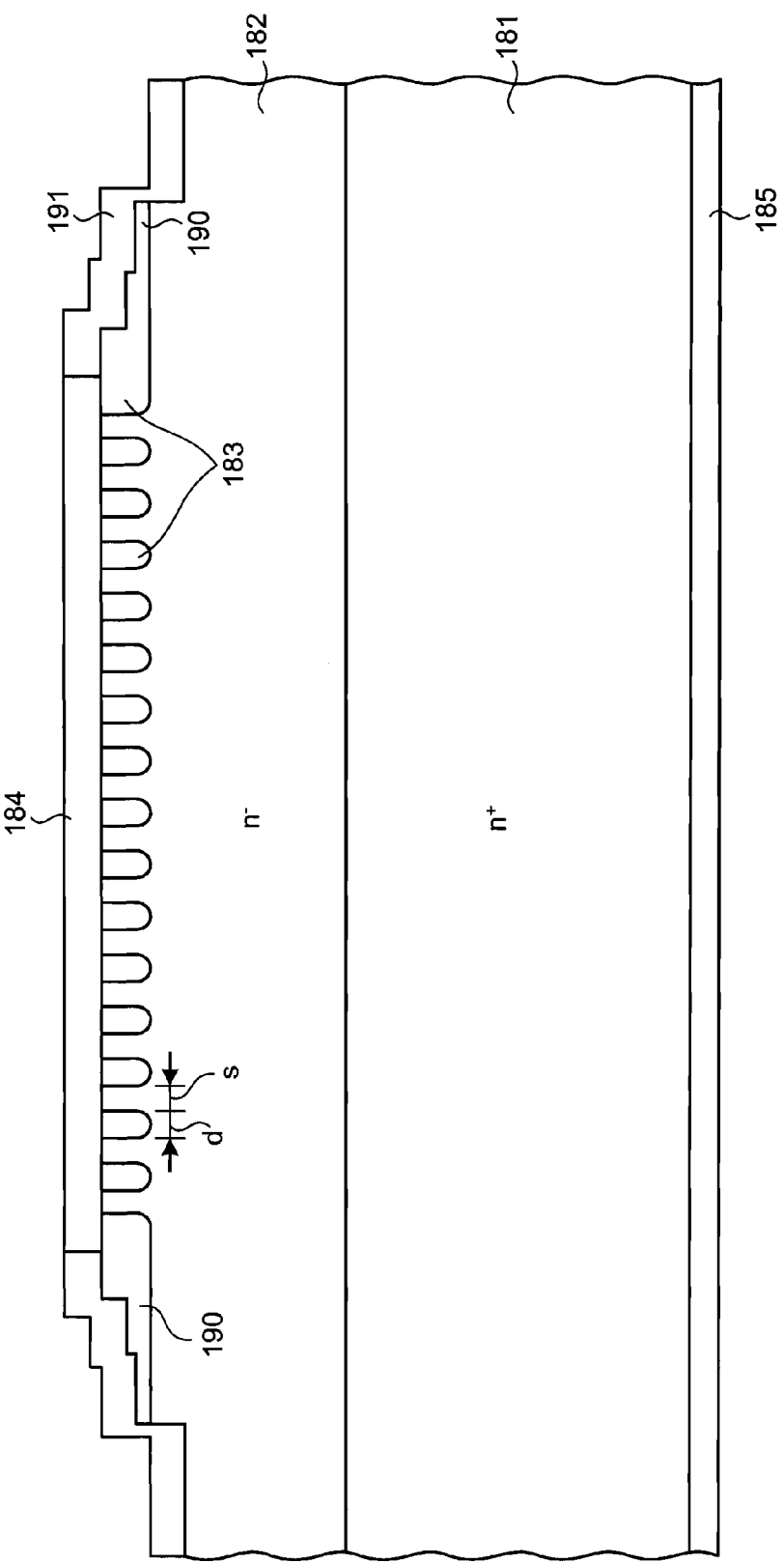
FIG. 18 is a cross-sectional diagram of a conventional complex diode.

The widths of Ti films 26a and 26b that are disposed on the mesa bottoms as described in (1) are widened. Preferably, the impurity concentration of the pinch-off p-layer 30 is set to be lower than the impurity concentration of the p$^+$-region constituting the pn-junctions of the conventional MPS diode (see FIG. 18). The reason for this is as follows: the pinch-off p-layer 30 functions as a region to mainly realize pinch-off and the function as the anode to inject carriers is weakened; the dose of the ion implantation can be reduced to form the pinch-off p-layer 30 and faults that are generated by the ion implantation can be reduced; and thereby, generation of a leak current can be suppressed. The impurity concentration of the pinch-off p-layer 30 may be about $2 \times 10^{17}$ cm$^{-3}$.

The pinch-off p-layer 30 is formed in the same ion implantation process as that for the p-fused field limiting layers 13. As described in (2), the JTE 10, the p-fused field limiting layers 13, and the pinch-off p-layer 30 are formed in the same ion implantation process. The pinch-off p-player 30 divides the Schottky barrier formed on the mesa bottom between the pn-main junction 35a and the pn-main junction 35b into the Schottky barrier 37b and the Schottky barrier 37c. The pinch-off p-layer 30 also divides the Schottky barrier formed on the mesa bottom between the pn-main junctions into a Schottky barrier 37a and a Schottky barrier not depicted.

The widths of p$^+$-anode layers 33a and 33b constituting the pn-main junctions 35a and 35b, p$^{++}$-contact layers 34a and 34b, and Ti films 36a and 36b as the ohmic contact metal of anode are narrower than those of the p$^+$-anode layers 3a and 3b, the p$^{++}$-contact layers 4a and 4b, and the Ti films 16a and 16b of the first embodiment. The other configurations are same as those of the MPS diode according to the first embodiment (see FIG. 1).

By employing this configuration, when a voltage is applied that is equal to or higher than a predetermined reverse voltage during application of a reverse bias, the portions of the n$^-$-drift layer 2 sandwiched by the p-fused field limiting layers 13 and the pinch-off p-layers 30 immediately under the Schottky barriers 37a, 37b, and 37c are pinched off by depletion layers spreading from these pn-junctions, and any increase of the electric field intensity in the Schottky barrier portions can be suppressed for a reverse application voltage equal to or higher than the above voltage. Thereby, a reverse withstand voltage equal to that of the first embodiment can be realized. On the other hand, when the switching operation is turned off, the accumulated carriers remaining in the n$^-$-drift layer 2 can be discharged using the Schottky barriers 37a, 37b, and 37c, which have widths that are wider than those of the first embodiment. Therefore, the accumulated carrier vanishing time period can be further shortened. As a result, the switching speed can be further increased and the switching loss can be further reduced.

Second Example

An MPS diode according to the second embodiment was fabricated as a second example. The MPS diode according to the second example had, for example, the Schottky barriers 37a, 37b, and 37c disposed therein, that were divided by the pinch-off p-layers 30. Such distances were each set to be 20 μm as that from the end of the p-fused field limiting layer 13 on the side of the Ti film 36a to an end of the pinch-off p-layer 30, and that from the end of the p-fused field limiting layer 13 on the side of the Ti film 36b to the other end between the pinch-off p-layers 30. The width of the pinch-off p-layer 30 was set to be 5 μm. The impurity concentration of the pinch-off p-layer 30 was set to be about $2 \times 10^{17}$ cm$^{-3}$. The other configurations were same as those of the MPS diode according to the first example. For comparison, a first to a third comparative examples were fabricated that were similar to the MPS diode according to the first example.

The impurity concentration, the width, and the depth of the JTE 10 to be the field limiting region were set to respectively be $3 \times 10^{17}$ cm$^{-3}$, 350 µm, and about 0.65 µm. In this case, the reverse application voltage at room temperature and with the leak current density of $2 \times 10^{-3}$ A/cm$^2$ was 13.6 kV and a higher withstand voltage was realized than those of the first and the second comparative examples.

The reverse recovery time period of the MPS diode according to the second example was 14 ns when a forward current with the forward current density of about 40 A/cm$^2$ was turned off after the current was caused to flow therein, and a quicker switching operation was enabled than that of the third comparative example. The reverse recovery current density was about 97 A/cm$^2$ and the switching loss was substantially equal to that of the MPS diode according to the first example. The testing conditions in this case were same as those for the MPS diode according to the first example.

As to the MPS diode according to the second example, one wafer was discovered that had thereon corners of the mesa bottoms over-etched in the portions from which the p$^+$-epitaxial layer was removed (mesa portions) and many protrusion-like trenches formed in the wafer due to the dispersion of the RIE etching condition. On a quarter of each wafer, the MPS diodes according to the second example had no p-fused field limiting layer 13 formed therein for the comparative experiments. The maximum depth of the over-etched protrusion-like trench was about 0.4 µm and there was concerned that the electric field excessively concentrated on the trench and reduced the withstand voltage. Due to the lack of a p-fused field limiting layer 13, the withstand voltage was naturally low of the diode having no p-fused field limiting layer 13 formed therein (first comparative example). However, among multiple first comparative examples, about 30% had withstand voltages that were significantly low relative to the average withstand voltage of the first comparative example (hereinafter, each "low withstand voltage first comparative example").

Corners of the mesa bottoms were observed using a photoemission microscope in a state where a portion of the anode electrode film that was buried in the mesa portions of the low withstand voltage first comparative example was removed by etching (for example, for a half of the distance in the direction perpendicular to the direction for the complex units to be arranged) and a reverse voltage was applied to the remaining anode electrode film. As a result, for the low withstand voltage first comparative example, unique light emission was observed at a relatively low reverse voltage on the trench of the corners of the mesa bottoms in the portion from which the anode electrode film was removed, indicating that the trenches of the corners of the mesa bottoms were the cause of the reduction of the withstand voltage. On the other hand, for the diodes having the p-fused field limiting layers 13 formed therein (for example, the MPS diodes according to the first and the second examples), no device was discovered that had conspicuous withstand voltage defects. It is presumed that the reason for this is that the p-fused field limiting layers 13 alleviated the concentration of the electric field using the protrusion-like trenches to prevent the withstand voltage from dropping, whereby the high withstand voltage was able to be realized.

As described, according to the second embodiment, the same effect as that of the first embodiment can be achieved.

Third Embodiment

Figure 4:
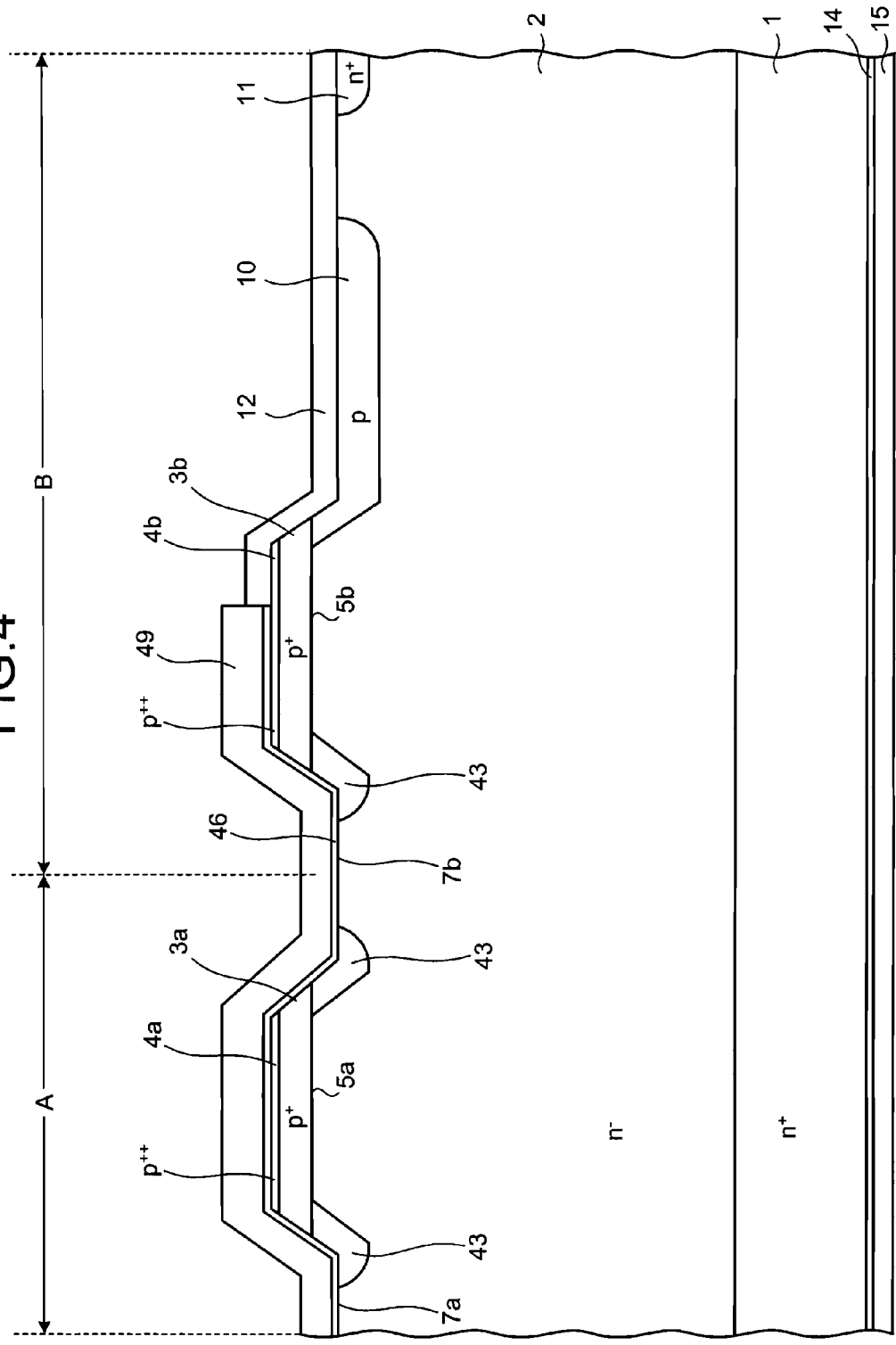
FIG. 4 is a cross-sectional diagram depicting an overview of an MPS diode according to a third embodiment.

FIG. 4 is a cross-sectional diagram depicting an overview of an MPS diode according to the third embodiment. The MPS diode depicted in FIG. 4 is, for example, a high withstand voltage MPS diode having a withstand voltage of a 13-kV class. The MPS diode may be configured as the first embodiment without forming any insulating protective film. Instead of the multiple Ti films, one Ti film may be disposed that covers substantially the entire anterior surface of the n$^+$-cathode substrate 1.

In the third embodiment, as depicted in FIG. 4, the side walls of the mesa portions have no insulating protective film on both sides of the p$^+$-anode layers 3a and 3b and the p$^{++}$-contact layers 4a and 4b. One Ti film 46 was disposed on the anterior surface of the n$^+$-cathode substrate 1. The Ti film 46 is in contact with the p$^{++}$-contact layers 4a and 4b, and the n$^-$-drift layer 2 exposed in the mesa bottoms. An anode electrode film 49 is disposed on the Ti film 46 covering the Ti film 46. The other configurations were same as those of the first embodiment.

According to the third embodiment, the lift-off process that is executed when the Ti films 6a, 6b, 16a, and 16b are formed in the first embodiment can be omitted. As a result, simplification of the semiconductor device manufacturing process is facilitated and the yield of the semiconductor device can be significantly improved, whereby cost reduction can be facilitated.

In the third embodiment, the anode electrode film 49 made of Au is in contact with the p-fused field limiting layers 43 through the Ti film 46. Therefore, the p-fused field limiting layer 43 is punched through when a high reverse voltage is applied. To prevent this, preferably, the thickness of the p-fused field limiting layer 43 is set to be, for example, 1.2 µm to be thicker than that of the first embodiment. The impurity concentration of the p-fused field limiting layer 43 is set to be, for example, $3.5 \times 10^{17}$ cm$^{-3}$ to be higher than that of the first embodiment.

Third Example

An MPS diode according to the third embodiment was fabricated as a third example. More specifically, the MPS diode according to the third example had no insulating protective film on the mesa portion side walls on both sides of the p$^+$-anode layers 3a and 3b and the p$^{++}$-contact layers 4a and 4b. The Ti film 46 was disposed, which continuously extended from the p$^{++}$-contact layer 4b to the mesa bottom and the p$^{++}$-contact layers 4a. The thickness and the impurity concentration of the p-fused field limiting layer 43 were set to respectively be 1.2 µm and $3.5 \times 10^{17}$ cm$^{-3}$. The other configurations were same as those of the MPS diode according to the first example.

The leak current density of the MPS diode according to the third example was $6 \times 10^{-3}$ A/cm$^2$ and somewhat increased when a reverse voltage of 16 kV was applied at room temperature. However, the withstand voltage indicating the avalanche breakdown was equal to or higher than 18 kV at room temperature providing the same result as that of the MPS diode according to the first example. For the MPS diode according to the third example, the function of injecting carriers as an anode in response to application of a forward voltage was somewhat enhanced and the on-voltage was reduced. More specifically, the on-voltage of the MPS diode according to the third example was 4.85 V with a forward voltage having the forward current density of about 40 A/cm$^2$ at room temperature.

As described, according to the third embodiment, the same effect as that of the first embodiment can be achieved.

Fourth Embodiment

Figure 5:
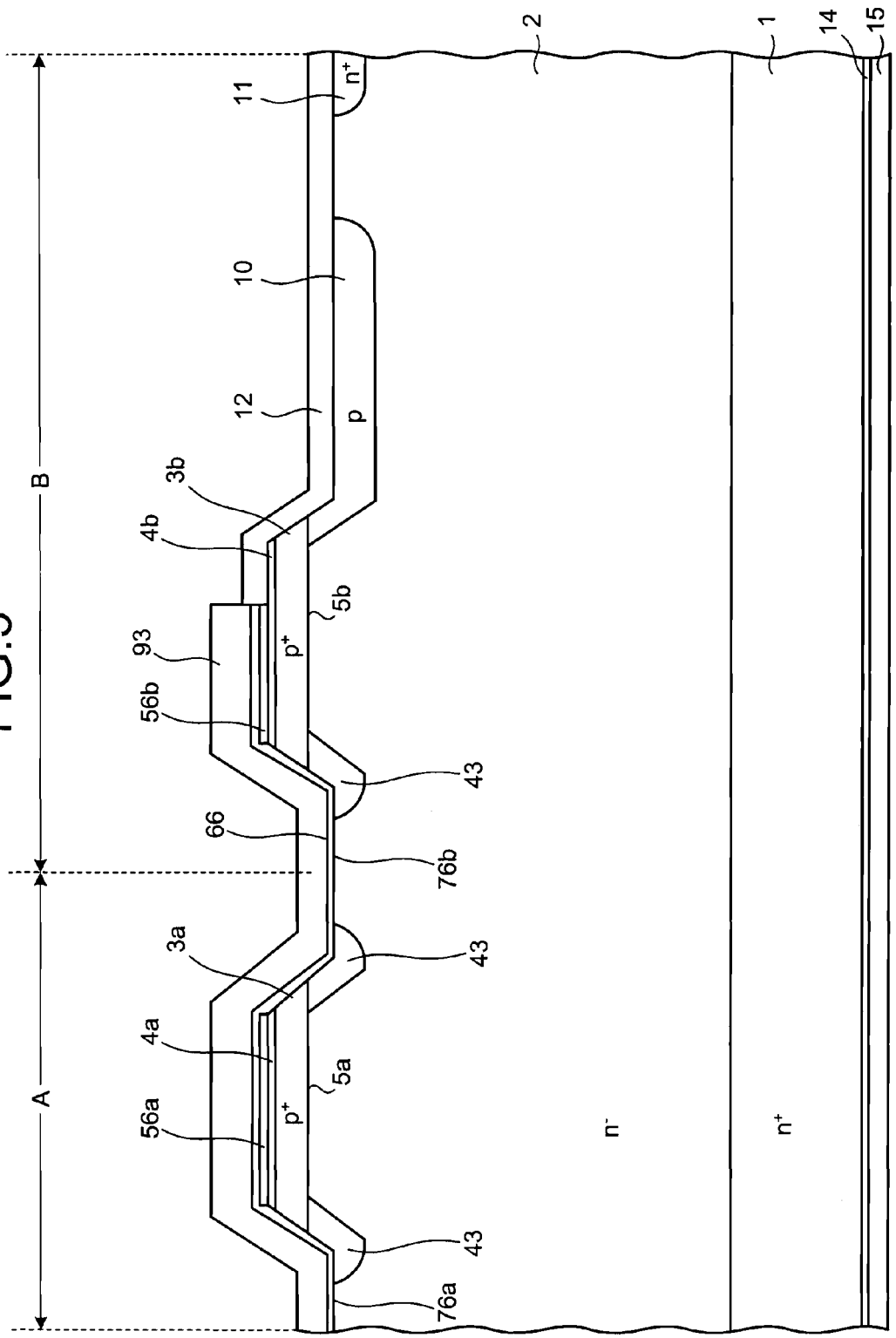
FIG. 5 is a cross-sectional diagram depicting an overview of an MPS diode according to a fourth embodiment.

FIG. 5 is a cross-sectional diagram depicting an overview of an MPS diode according to a fourth embodiment. The MPS diode depicted in FIG. 5 is, for example, a high withstand voltage MPS diode having a withstand voltage of a 16-kV class. The MPS diode according to the fourth embodiment has an Ni film disposed therein instead of the Ti film of the MPS diode according to the third embodiment. A Ti film for ohmic contact may be disposed between the p$^{++}$-contact layers 4a and 4b and the Ni film.

In the fourth embodiment, as depicted in FIG. 4, Ti films 56a and 56b are disposed respectively on surfaces of the p$^{++}$-contact layers 4a and 4b. An Ni film 66 is disposed that continuously extends from the Ti films 56a and 56b disposed on the p$^{++}$-contact layers 4a and 4b to the mesa bottoms. The Ti films 56a and 56b are disposed as the ohmic contact metal for the pn junctions and the Ni film 66 is disposed as the Schottky barrier metal. In this case, after forming the Ti films 56a and 56b, the Ni film 66 is independently formed. The other configurations are same as those of the third embodiment.

Fourth Example

An MPS diode according to the fourth embodiment was fabricated as a fourth example. More specifically, the MPS diode according to the fourth example had the Ti films 56a and 56b formed therein as the ohmic contact metal and the Ni film 66 formed therein as the Schottky barrier metal. The other configurations were same as those of the MPS diode according to the third example.

For the MPS diode according to the fourth example, a thermal treatment was executed for the Ti films 56a and 56b after forming the Ti films 56a and 56b for ohmic contact and before forming the Ni film 66 to be the Schottky barrier metal. Therefore, the Ni film 66 to be the Schottky barrier metal was not affected by the thermal treatment executed for the Ti films 56a and 56b, enabling the temperature to be set to a high temperature of 950° C. of the thermal treatment executed for the Ti films 56a and 56b, and an excellent ohmic contact of the P$^{++}$-contact layers 4a and 4b with low contact resistance was able to be formed. Thereby, the forward voltage of the MPS diode according to the fourth example was able to be reduced by about 0.4 V and the stationary loss was able to be reduced.

As described, according to the fourth embodiment, the same effect as that of the first embodiment can be achieved.

Fifth Embodiment

Figure 6:
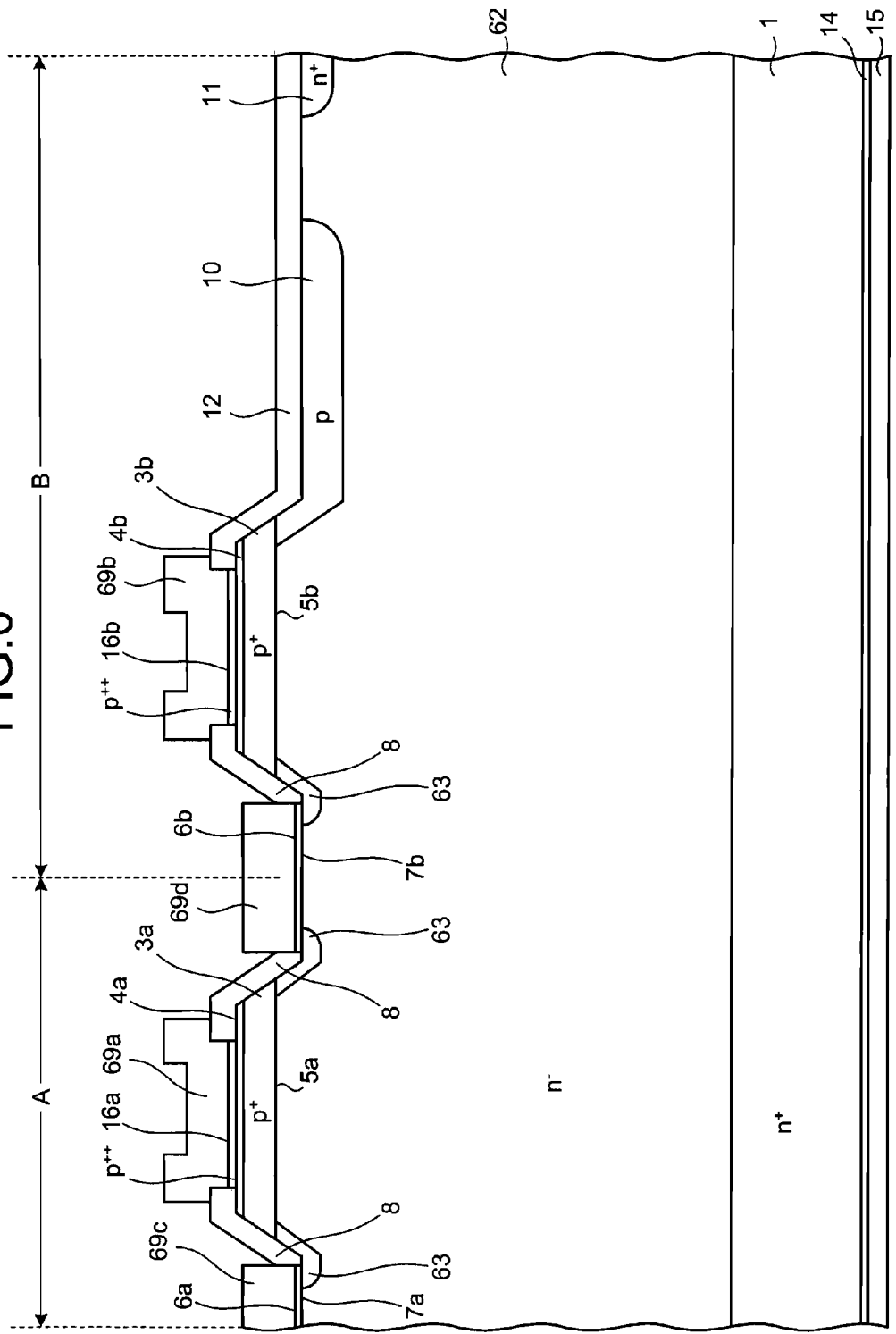
FIG. 6 is a cross-sectional diagram depicting an overview of an MPS diode according to a fifth embodiment.

FIG. 6 is a cross-sectional diagram depicting an overview of an MPS diode according to a fifth embodiment. The MPS diode depicted in FIG. 6 is, for example, a high withstand voltage MPS diode having a withstand voltage of a 20-kV class. The MPS diode according to the fifth embodiment has: anode electrode films disposed separately from each other above the pn junctions 5a and 5b of the MPS diode according to the first embodiment; and anode electrode films disposed separately from each other above the Schottky barriers 7a and 7b thereof.

In the fifth embodiment, as depicted in FIG. 6, the Ti films 6a and 6b forming the Schottky barriers 7a and 7b are respectively in contact with anode electrode films 69c and 69d. The Ti films 16a and 16b disposed above the pn-junctions 5a and 5b are respectively in contact with anode electrode films 69a and 69b. The impurity concentration of an n$^-$-drift layer 62 is, for example, 3×10$^{14}$ cm$^{-3}$ and is lower than that of the first embodiment. The thickness of the n$^-$-drift layer 62 is, for example, 220 μm and is thicker than that of the first embodiment. The impurity concentration of a p-fused field limiting layer 63 is, for example, 3×10$^{17}$ cm$^{-3}$ and is higher than that of the first embodiment. The other configurations are same as those of the first embodiment.

According to the fifth embodiment, no anode electrode film is present on the mesa portion side walls for the ends of the p$^+$-anode layers 3a and 3b to be exposed in. Therefore, no carrier induction occurs on the mesa portion side walls due to an electric field effect of the anode electrode films when a reverse voltage is applied. Therefore, compared to the first embodiment, a high-withstand-voltage MPS diode can be realized that is stable and has low dispersion.

The MPS diode according to the fifth embodiment has a planar layout as follows. As depicted in FIG. 2, the JTE 10 in contact with the p$^+$-anode layer 3b encompasses the outer peripheral portions of the complex unit group including 30 units 20 and the one p$^+$-anode layer 3b disposed parallel to the complex unit group in the direction for the units 20 to be arranged. On the other hand, a p$^+$-layer extending in the direction for the units 20 to be arranged (hereinafter, "laterally long p$^+$-layer", not depicted) is separately disposed in contact with the 31 p$^+$-anode layers 3a and 3b and the 30 Schottky barriers 7a and 7b, in the outer peripheral portions of the complex unit group including the 30 units 20 and the one p$^+$-anode layer 3b disposed in parallel to the complex unit group in the direction perpendicular to the direction for the units 20 to be arranged. The outer peripheral portion of the laterally long p$^+$-layer is surrounded by the JTE 10 in contact with the laterally long p$^+$-layer. The channel stopper 11 encompasses the outer peripheral portion of the JTE 10.

The Ti films that are to be the ohmic contact metal and the Au electrode are formed on the laterally long p$^+$-layer (not depicted) and are connected to the anode electrode films 69a, 69b, 69c, and 69d disposed above the p$^+$-anode layers 3a and 3b. Therefore, the laterally long p$^+$-layer functions as the p$^+$-anode layer. The laterally long p$^+$-layer, the Ti films 6a and 6b that are to be the Schottky metal, and the anode electrode films 69a, 69b, 69c, and 69d extend on the insulating protective film that is in contact with the end of the laterally long p$^+$-layer and are connected to the Ti films that are to be the ohmic contact metal and the Au electrode on the laterally long p$^+$-layer.

Fifth Example

The MPS diode according to the fifth embodiment was fabricated as a fifth example. More specifically, in the MPS diode according to the fifth example, the anode electrode films 69a, 69b, 69c, and 69d are respectively in contact with the Ti films 16a, 16b, 6a, and 6b. The impurity concentration and the thickness of the n$^-$-drift layer 62 were set to respectively be 3×10$^{14}$ cm$^{-3}$ and 220 μm, having the laterally long p$^+$-layer disposed thereon that is in contact with the Ti films 16a, 16b, 6a, and 6b, and the anode electrode films 69a, 69b, 69c, and 69d. The impurity concentration of the p-fused field limiting layers 63 was set to be 3×10$^{17}$ cm$^{-3}$. The other configurations were same as those of the MPS diode according to the first example.

The withstand voltage indicating the avalanche breakdown of the MPS diode according to the fifth example was a high voltage that was equal to or higher than 21 kV at room temperature and the dispersion of the leak current was also able to be reduced by 40% compared to that of the MPS diode according to the first example. The effect of the electric field effects of the Ti films forming the ohmic contact metal and the Au electrode on the laterally long p$^+$-layer was not at a level that was practicably problematic for the reasons that include small area ratios thereof.

As described, according to the fifth embodiment, the same effect as that of the first embodiment can be achieved.

Sixth Embodiment

Figure 7:
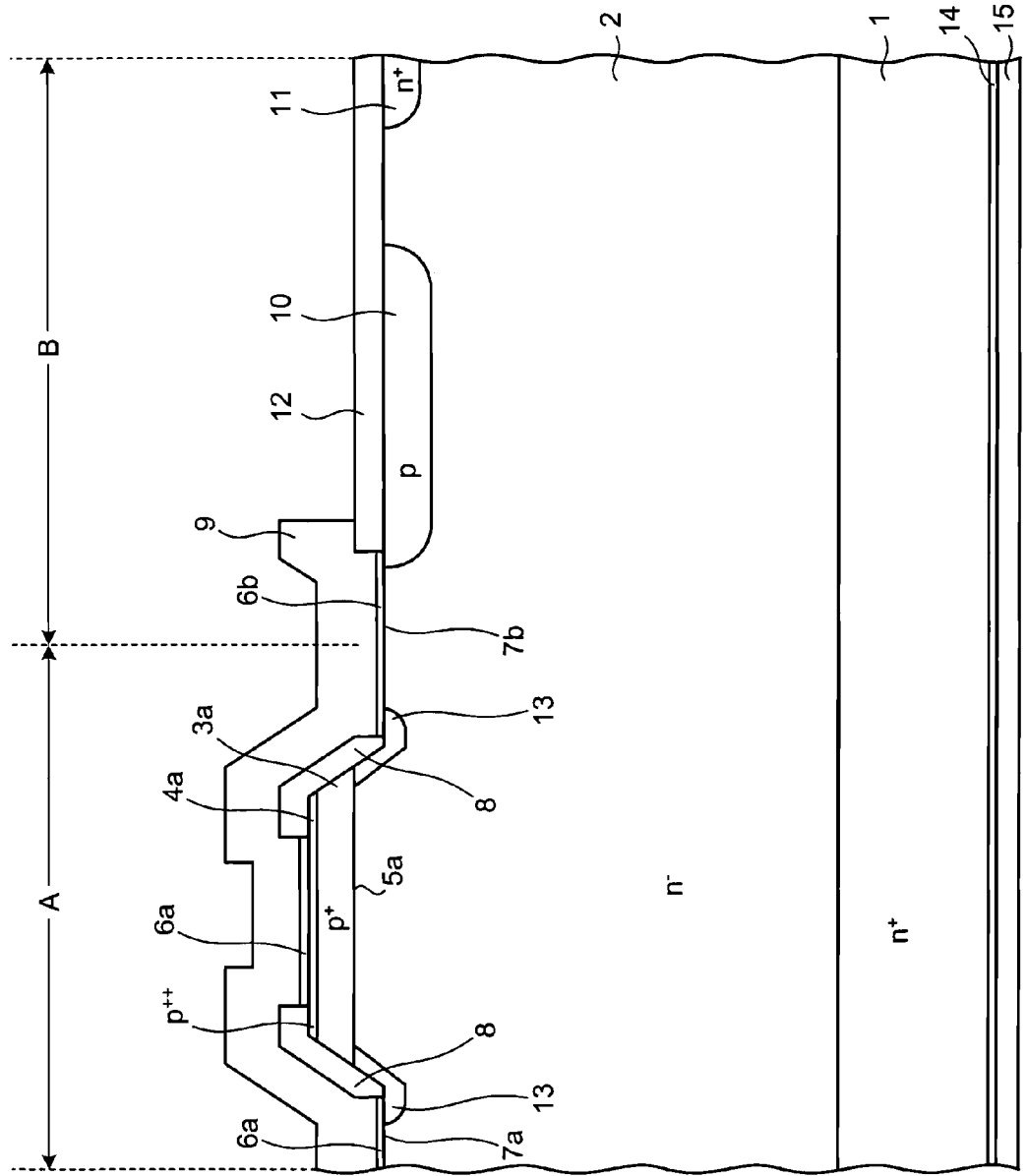
FIG. 7 is a cross-sectional diagram depicting an overview of an MPS diode according to a sixth embodiment.

FIG. 7 is a cross-sectional diagram depicting an overview of an MPS diode according to a sixth embodiment. The MPS diode depicted in FIG. 7 is, for example, a high withstand voltage MPS diode having a withstand voltage of a 16-kV class. The MPS diode according to the sixth embodiment has no pn-main junction 5b disposed in the outermost peripheral portion B of the MPS diode according to the first embodiment.

In the sixth embodiment, in the outermost peripheral portion B, the $p^+$-anode layer 3b and the $p^{++}$-contact layer 4b constituting the pn-main junction 5b are not disposed. An end of the Ti film 6b constituting the Schottky barrier 7b overlaps with and is in contact with the JTE 10. The width of this overlapping portion may be, for example, about 3 μm. The width of the Schottky barrier 7b is 40 μm similarly to that of the first embodiment. The other configurations are same as those of the MPS diode according to the first embodiment.

In the first embodiment, the width of the $p^+$-anode layer 3b of the outermost peripheral portion B is substantially equal to the width of the $p^+$-anode layer 3a of the complex unit A and therefore, the discharge time period of the accumulated carriers in the $n^-$-drift layer 2 of the outermost peripheral portion B becomes longer than the discharge time period of the accumulated carriers in the $n^-$-drift layer 2 of the complex unit A when the switching operation is turned off. As a result, the reverse recovery time period is long. On the other hand, in the fifth embodiment, not disposing the $p^+$-anode layer 3b in the outermost peripheral portion B enables reduction of the reverse recovery time period. The reason for this is that, in the complex unit A of the first embodiment, the remaining carriers are discharged from both sides by the Schottky barriers 7a and 7b formed on the mesa bottoms on both sides of the $p^+$-anode layer 3a, whereas, in the outermost peripheral portion B, the remaining carriers are discharged only from the side of the one Schottky barrier 7b.

Sixth Example

The MPS diode according to the sixth embodiment was fabricated as a sixth example. More specifically, the MPS diode according to the sixth example had no $p^+$-anode layer 3b disposed in the outermost peripheral portion B. The other configurations were same as those of the MPS diode according to the first example. The MPS diode according to the sixth example did not have any imbalance in the discharge time period as that of the MPS diode according to the first example and the reverse recovery time period was able to be shortened.

The reverse recovery time period was measured for the MPS diode according to the sixth example similarly to the MPS diode according to the first example. The measurement conditions were same as those for the MPS diode according to the first example. The reverse recovery time period of the MPS diode according to the sixth example was 21 ns and was able to be reduced by about 20% relative to the MPS diode according to the first example. As a result, the switching loss was also able to be reduced. The withstand voltage of the MPS diode according to the sixth example was 16.2 kV and was somewhat lower than that of the MPS diode according to the first example. The reason for this is that electric field concentration was high at the end of the anode electrode film 9 on the JTE 10. In this case, additional thickening of the thickness of the passivation film 12 on the side of the anode electrode film 9 enables alleviation of the electric field concentration at the end of the anode electrode film 9.

As described, according to the sixth embodiment, the same effect as that of the first embodiment can be achieved.

Seventh Embodiment

Figure 8:
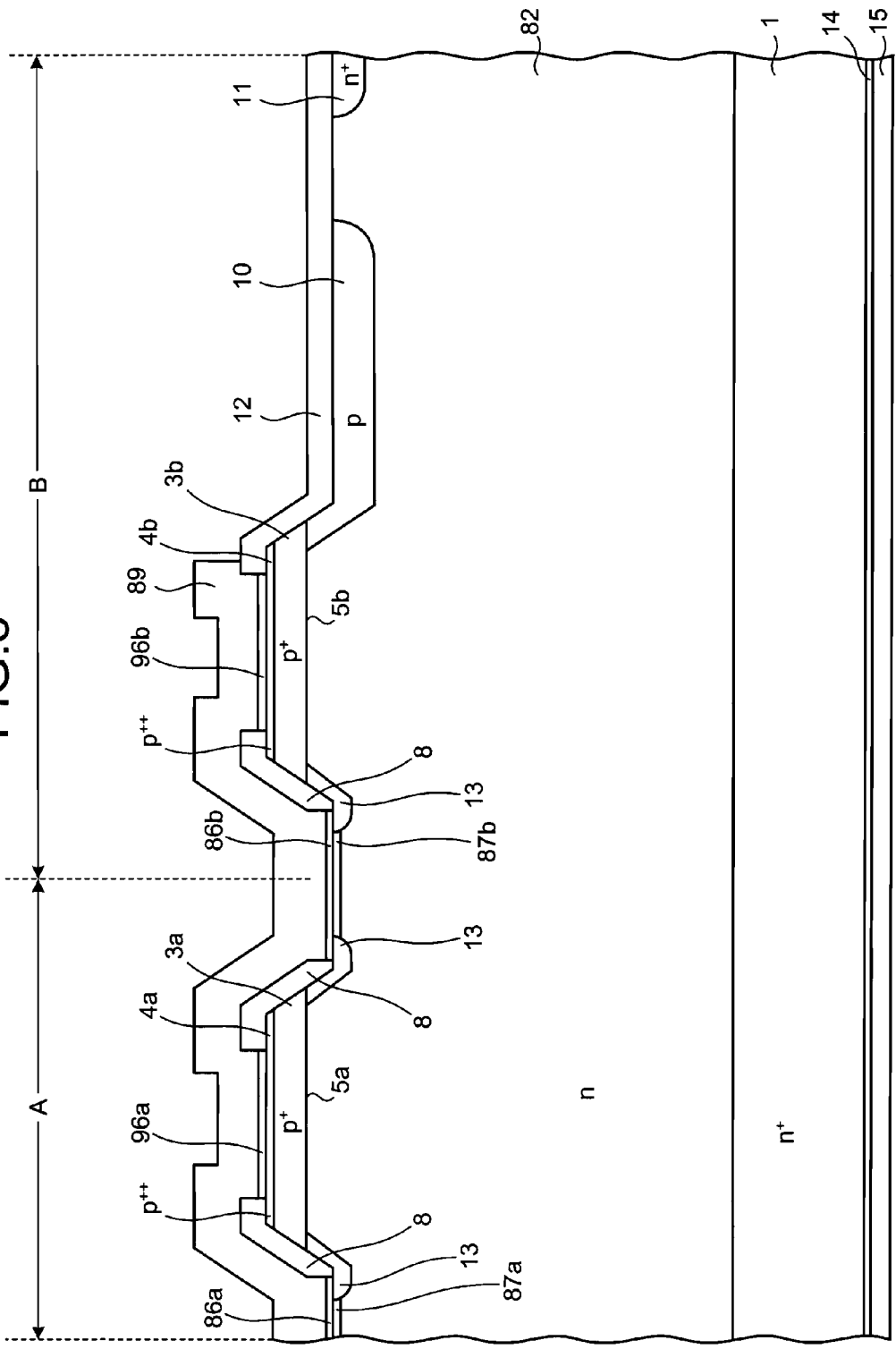
FIG. 8 is a cross-sectional diagram depicting an overview of a complex diode according to a seventh embodiment.

FIG. 8 is a cross-sectional diagram depicting an overview of a complex diode according to a seventh embodiment. The complex diode depicted in FIG. 8 is, for example, a high withstand voltage complex diode having a withstand voltage of a 16-kV class. The complex diode according to the seventh embodiment may have shallow pn junctions configured by p-layers that are shallower than and that have impurity concentrations that are lower than those of the $p^+$-anode layers 3a and 3b constituting the pn-main junctions 5a and 5b (shallow pn-layers) instead of the Schottky barriers 7a and 7b of the MPS diode according to the first embodiment.

In the seventh embodiment, the impurity concentration and the thickness of a n-drift layer 82 respectively are $4\times10^{14}$ $cm^{-3}$ and 170 μm. Al—Si alloy electrode films 86a and 86b are formed on the mesa bottoms. The Al—Si alloy electrode films 86a and 86b are formed using a lift-off approach. The lift-off approach is an approach of: covering the entire surface of the device with resist; removing by etching only the resist on the mesa bottoms using photolithography; thereafter, vapor-depositing an Al—Si alloy film; and thereby, leaving the Al—Si alloy electrode films 86a and 86b only on the mesa bottoms. Thereafter, the Al in the Al—Si alloy electrode films is caused to invade into SiC (the n-drift layer 82) by applying a thermal treatment at a temperature equal to or higher than 700° C. and equal to or lower than 1,100° C. Thereby, the shallow pn-junctions (second layers, third semiconductor regions) 87a and 87b are formed in the surface layer of the mesa bottoms. The impurity concentration and the thickness of each of the shallow p-layers forming the shallow pn-junctions 87a and 87b respectively may be, for example, $8\times10^{16}$ $cm^{-3}$ and about 20 nm, respectively. The width C of each of the mesa bottoms having the shallow pn-junctions 87a and 87b formed thereon may be 40 μm and the interval D between the mesa bottoms may be 60 μm.

Ti films 96a and 96b are formed on the $p^{++}$-contact layers 4a and 4b as the ohmic contact metal using the lift-off approach. An anode electrode film 89 made of Al is formed on the anterior surface of the $n^+$-cathode substrate 1 through the insulating protective film 8 disposed on the mesa portion side walls. Other conditions for the anode electrode film 89 are same as those for the anode electrode film of the first embodiment.

The p-fused field limiting layers 13 are formed in the surface layer of the n-drift layer 82 exposed between the pn-main junction 5a and the shallow pn-junction 87a and between the pn-main junctions 5a and 5b, and the shallow pn-junction 87b. The impurity concentration and the width of the p-fused field limiting layers 13 respectively are about $1\times10^{17}$ $cm^{-3}$ and 4 μm. The width of the p-fused field limiting layer 13 is each of the lengths from positions at which the pn-main junctions 5a and 5b are exposed on the mesa portion side walls to the longest ends from the corners of the mesa bottoms of the overlapping portions of the shallow pn-junctions 87a and 87b on the mesa bottoms, and the p-fused field limiting layers 13. The other configurations are same as those of the first embodiment.

Figure 9:
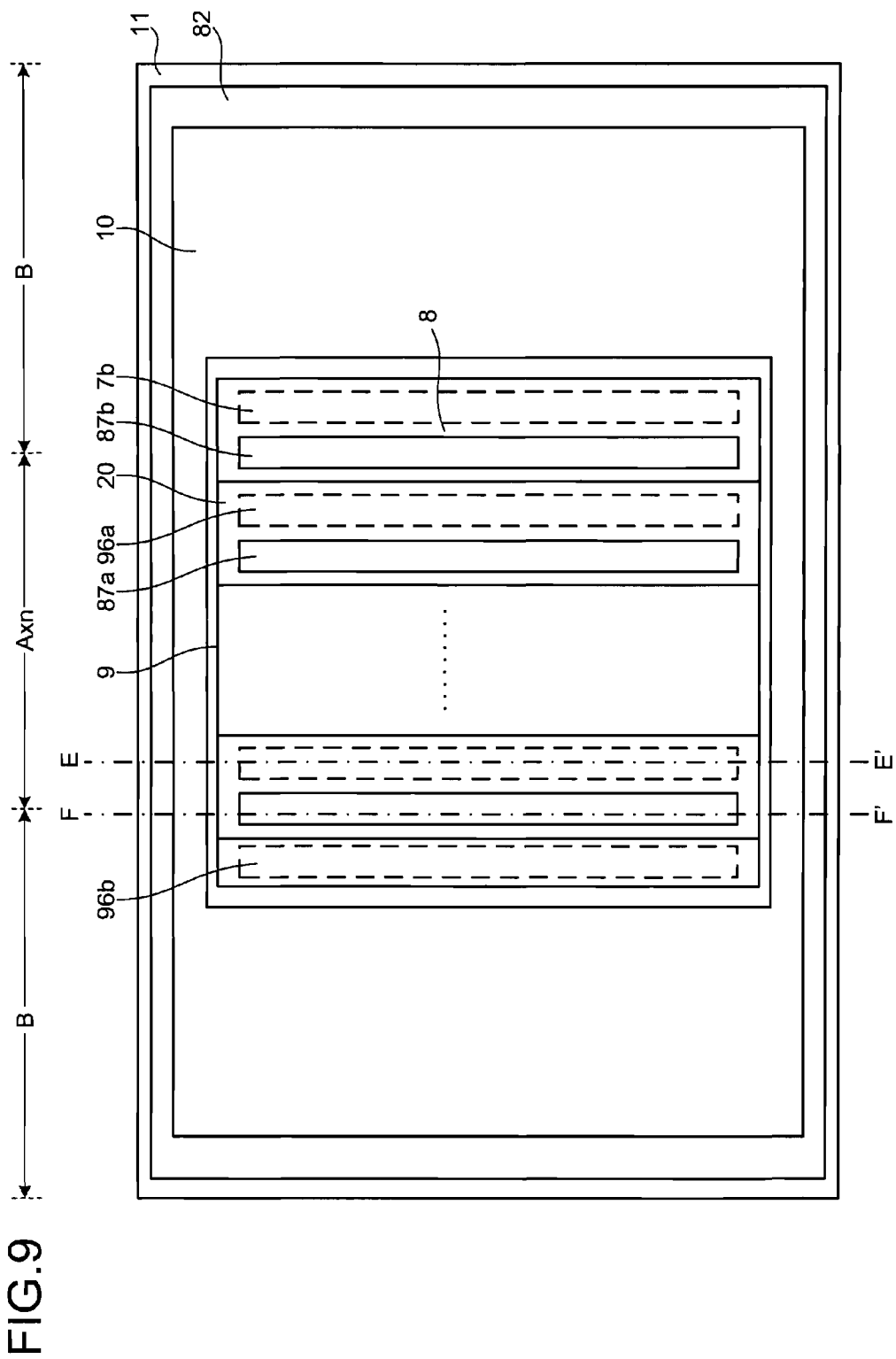
FIG. 9 is a plan view depicting an overview of the complex diode according to the seventh embodiment.

FIG. 9 is a plan view depicting an overview of the complex diode according to the seventh embodiment. The planar layouts of the complex units A and the outermost peripheral portions B formed on a chip are same as those of the first embodiment. The shallow pn-junctions 87a and 87b, and the Ti films 96a and 96b in the unit 20 are similarly disposed to the Schottky barriers 7a and 7b, and the Ti films 16a and 16b of the first embodiment depicted in FIG. 2.

Similarly to the first embodiment, in the seventh embodiment, the shallow pn-junctions 87a and 87b can be formed at positions deeper than those of the pn-main junctions 5a and 5b. Therefore, when the switching operation is turned off, the distance can be easily shortened to the accumulated carriers remaining in the n-drift layer 82 immediately under the pn-main junctions 5a and 5b. As a result, the accumulated carriers can be more quickly and more efficiently be discharged through the shallow pn-junctions 87a and 87b having built-in voltages that are lower than those of the pn-main junctions 5a and 5b. Therefore, the accumulated carrier vanishing time period can be shortened, the switching speed can be increased, the switching loss can be reduced, and the reverse recovery current can be reduced.

Seventh Example

A complex diode according to the seventh embodiment was fabricated as a seventh example. More specifically, the complex diode according to the seventh example employed an Al wire instead of the Au wire of the MPS diode according to the first example. The complex diode according to the seventh example had an anode electrode film 89 made of Al and the shallow pn-junctions 87a and 87b formed therein instead of the anode electrode film 9 made of Au and the Schottky barriers 7a and 7b of the MPS diode according to the first example. The other configurations were same as those of the MPS diode according to the first example. An operation test was executed for the complex diode according to the seventh example.

A voltage was applied to the complex diode according to the seventh example between the anode electrode film 89 and the cathode electrode film 15 to acquire the forward direction state. When this voltage applied was increased to a voltage around 2.7 V, the current started to rapidly increase. This is because: the shallow pn-junctions 87a and 87b and the pn-main junctions 5a and 5b were forward-biased; injection of the minority carriers started; thereby, the conductivity of the n-drift layer 82 was varied; and the internal resistance was reduced. The average forward current density of the complex diode according to the seventh example was about 45 A/cm$^2$ at room temperature and with the forward voltage of 5 V and was equal to that of the Si diode having the withstand voltage of a 5-kV class even though the complex diode was a high withstand voltage diode. Thus, the complex diode according to the seventh example achieved the same effect as that of the MPS diode according to the first example.

A voltage was applied to the complex diode according to the seventh example between the anode electrode film 89 and the cathode electrode film 15 to acquire the reverse direction state. The withstand voltage current density of the leak current of the complex diode according to the seventh example: was equal to or lower than $1.5 \times 10^{-3}$ A/cm$^2$ at room temperature even when the voltage applied was 10 kV; and was equal to or lower than $3 \times 10^{-3}$ A/cm$^2$ at room temperature and was equal to or lower than $4 \times 10^{-2}$ A/cm$^2$ at a high temperature of 250° C. even when the voltage applied was 16 kV, to present low values and show an excellent electric property. The withstand voltage indicating the avalanche breakdown was equal to or higher than 18 kV at room temperature and also showed an excellent electric property.

For comparison, a semiconductor device was fabricated that had no p-fused field limiting layer 13 disposed between the pn-main junctions 5a and 5b, and the shallow pn-junctions 7a and 7b (hereinafter, "fourth comparative example") and a same operation test was executed therefor as that for the complex diode according to the seventh example. The other configurations of the fourth comparative example were same as those of the complex diode according to the seventh example. The forward withstand voltage of the fourth comparative example was about 5.2 kV. A semiconductor device was fabricated that had, instead of the p-fused field limiting layers 13: the shallow pn-junctions disposed away from the mesa bottom corners; and only guard rings, disposed therein (hereinafter, "fifth comparative example"), and a same operation test was executed therefor as that for the complex diode according to the seventh example. The other configurations of the fifth comparative example were same as those of the complex diode according to the seventh example. The forward withstand voltage of the fifth comparative example was about 6.8 kV. Thus, the complex diode according to the seventh example achieved the same effect as that of the MPS diode according to the first example.

The reverse recovery time period of the complex diode according to the seventh example was 26 ns when a forward current having the forward current density of about 50 A/cm$^2$ was turned off after the current was caused to flow therein, and the reverse recovery current density thereof was low that was about 34 A/cm$^2$. The complex diode showed extremely excellent electric properties. The testing conditions in this case were same as those for the MPS diode according to the first example. For comparison, a diode was fabricated that had no shallow pn-junctions 87a and 87b formed therein and that had only the pn-junctions 5a and 5b (hereinafter, "sixth comparative example") and the reverse recovery time period and the reverse recovery current density thereof were measured under the same conditions as those of the complex diode according to the seventh example. The other configurations of the sixth comparative example were same as those of the complex diode according to the seventh example. The reverse recovery time period of the sixth comparative example was 57 ns. The reverse recovery current density of the sixth comparative example was about 95 A/cm$^2$ and was high. The complex diode according to the seventh example was able to achieve a lower loss, a higher speed, and a softer recovery effect than those of the sixth comparative example.

For the complex diode according to the seventh example, the width C was set to be 40 µm of the mesa bottoms having the shallow pn-junctions 87a and 87b formed thereon and the interval D between the mesa bottoms was set to be 60 µm. However, the width C and the interval D may be varied similarly to the MPS diode according to the first example. Thereby, the trade-off relation between the on-voltage and the reverse recovery time period becomes changeable. For example, when: the width C of the mesa bottom was set to be 60 µm; the interval D between the mesa bottoms was set to be 40 µm; and the complex diode was energized at room temperature and with the forward current density of about 50 A/cm$^2$, the on-voltage was increased to 5.6 V while the reverse recovery time period was able to be reduced to 19 ns.

When Al wire-bonding was applied to the anode electrode film 9 of the complex diode according to the seventh example, the mechanical stress applied to the bonded portion of the anode electrode film 9 and the Al wire (the external force applied to the anode electrode film 9) alleviated the stress applied to a portion in the vicinity of each of the pn-junctions 5a and 5b, similarly to the MPS diode according to the first example. The shallow pn-junctions 87a and 87b were formed on the mesa bottoms and therefore, the external force applied to the anode electrode film 9 was not directly applied to the portion in the vicinity of each of the shallow pn-junctions 87*a* and 87*b* during the wire-bonding. Therefore, damage to the n-drift layer 82 constituting the shallow pn-junctions 87*a* and 87*b* (hereinafter, each "shallow pn-junction portion") was avoidable similarly to the MPS diode according to the first example. The reason for this is same as that for the MPS diode according to the first example. More specifically, a reverse voltage application test at a high temperature of 200° C. and with an applied voltage of 16 kV, and an energization test with a forward current density of 40 A/cm$^2$ were executed each for about 1,000 hours for the complex diode according to the seventh example. As a result, no conspicuous degradation was discovered for any property of the complex diode according to the seventh example.

As described, according to the seventh embodiment, the same effect as that of the first embodiment can be achieved.

Eighth Embodiment

Figure 10:
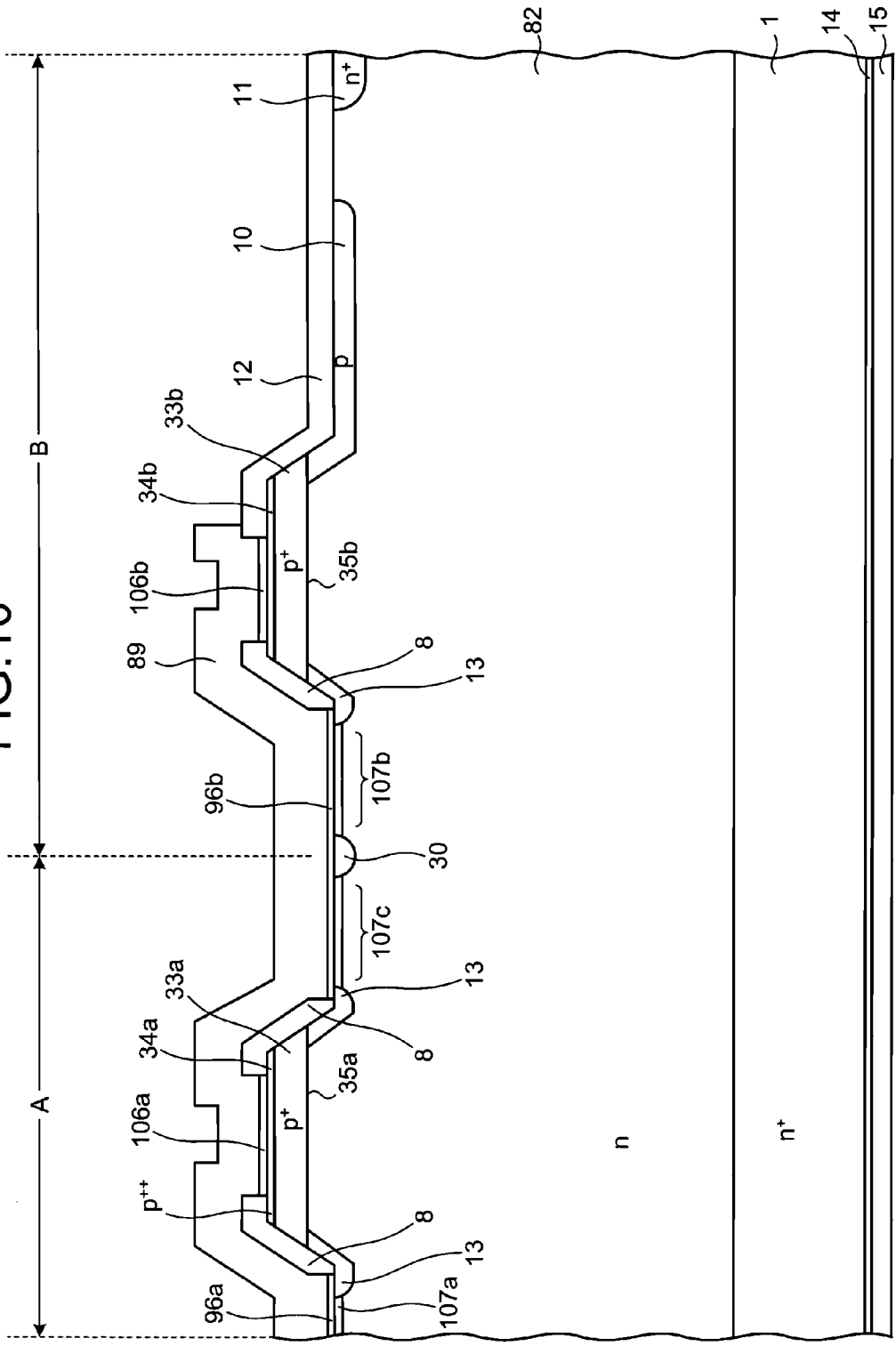
FIG. 10 is a cross-sectional diagram depicting an overview of a complex diode according to an eighth embodiment.

FIG. 10 is a cross-sectional diagram depicting an overview of a complex diode according to an eighth embodiment. The complex diode depicted in FIG. 10 is, for example, a 13-kV-class high withstand voltage complex diode apparatus. The complex diode according to the eighth embodiment has shallow pn-junctions 107*a*, 107*b*, and 107*c* disposed therein instead of the Schottky barriers 37*a*, 37*b*, and 37*c* of the MPS diode according to the second embodiment.

In the eighth embodiment, the widths are widened of Ti films 96*a* and 96*b* disposed on the mesa bottoms. The pinch-off p-layer 30 divides a shallow pn-junction formed on the mesa bottom between the pn-main junction 35*a* and the pn-main junction 35*b* into a shallow pn-junction 107*b* and a shallow pn-junction 107*c*. The pinch-off p-layer 30 also divides a shallow pn-junction formed on the mesa bottom between the pn-main junctions 35*a* into a shallow pn-junction 107*a* and a shallow pn-junction not depicted.

The widths of Ti films 106*a* and 106*b* as the ohmic contact metal for the anode are equal to those of the Ti films 36*a* and 36*b* of the second embodiment. The other configurations are same as those of the first embodiment (see FIG. 1). The configurations of the n-drift layer 82 and the anode electrode film 89 are same as those of the seventh embodiment. The impurity concentration of the pinch-off p-layer 30 may be equal to the impurity concentration of the p-fused field limiting layers 13.

Eighth Example

A complex diode according to the eighth embodiment was fabricated as an eighth example. More specifically, the complex diode according to the eighth example had, for example, the shallow pn-junctions 107*a*, 107*b*, and 107*c* disposed therein that are divided by, for example, the pinch-off p-layer 30. The impurity concentration of the pinch-off p-layer 30 was set to be 2×10$^{17}$ cm$^{-3}$ that is equal to that of the p-fused field limiting layer. The complex diode had the n-drift layer 82 and the anode electrode film 89 disposed therein similarly to the complex diode according to the seventh example. The impurity concentration of the JTE 10 to be the field limiting region was set to be 2×10$^{17}$ cm$^{-3}$. The other configurations were same as those of the MPS diode according to the second example. The reverse applied voltage of the complex diode according to the eighth example was 13.6 kV at room temperature and with the leak current density of 2×10$^{-3}$ A/cm$^2$ and a high withstand voltage was able to be realized similarly to the MPS diode according to the second example.

The reverse recovery time period of the complex diode according to the eighth example was 15 ns when a forward current having the forward current density of about 50 A/cm$^2$ was turned off after the current was caused to flow therein, and the speed of the switching operation thereof was able to be increased to a level equal to that of the MPS diode according to the second example. The reverse recovery current density was about 30 A/cm$^2$ and the switching loss was able to be improved compared to that of the complex diode according to the seventh example.

In the complex diode according to the eighth example, the p-fused field limiting layer 13 was able to alleviate the electric field concentration on the corners of the mesa bottoms similarly to the MPS diode according to the second example and any reduction of the withstand voltage was able to be prevented.

As described, according to the eighth embodiment, the same effect as that of the first embodiment can be achieved.

Ninth Embodiment

Figure 11:
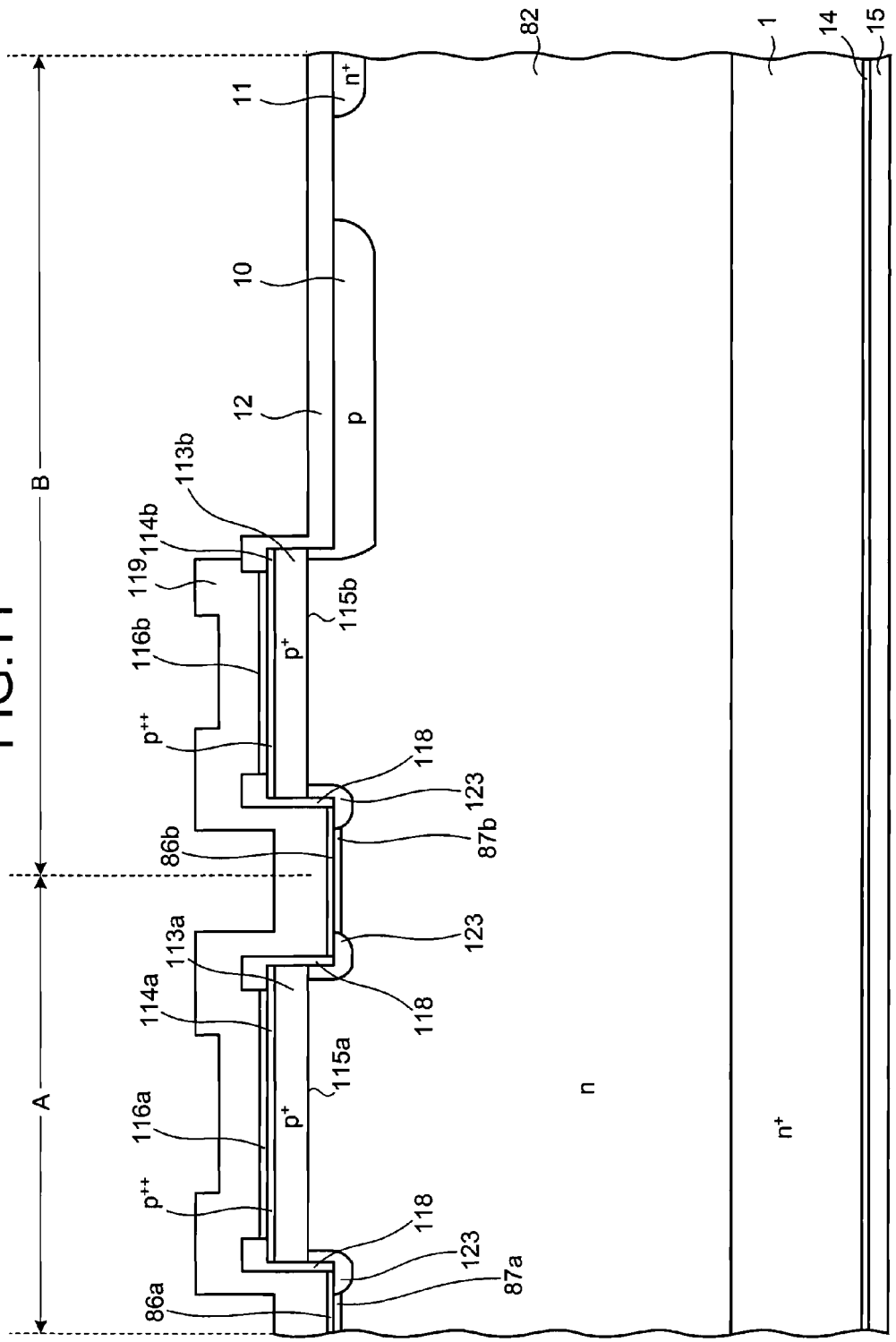
FIG. 11 is a cross-sectional diagram depicting an overview of a complex diode according to a ninth embodiment.

FIG. 11 is a cross-sectional diagram depicting an overview of a complex diode according to a ninth embodiment. The complex diode depicted in FIG. 11 is, for example, a high withstand voltage complex diode apparatus having a withstand voltage of a 10-kV class. The complex diode according to the ninth embodiment may have the p$^+$-epitaxial layer removed to form trench-like shapes instead of the mesa portions of the complex diode according to the seventh embodiment. The shallow pn-junctions 87*a* and 87*b* may be disposed on trench bottoms. More specifically, the ninth embodiment is different in two items as follows from the seventh embodiment. The other configurations are same as those of the complex diode according to the seventh embodiment.

(1) A p$^+$-epitaxial layer and a p$^{++}$-epitaxial layer are sequentially deposited on the surface of the n-drift layer 82; and the epitaxial layers are removed by the RIE technique, excluding the portions to be p$^+$-anode layers 113*a* and 113*b* and *p$^{++}$*-contact layers 114*a* and 114*b* to process to form the trenches. Thereby, the p$^+$-anode layers 113*a* and 113*b* and the p$^{++}$-contact layers 114*a* and 114*b* are formed. The widths of the p$^+$-anode layers 113*a* and 113*b* and the p$^{++}$-contact layers 114*a* and 114*b* are wider than those of the p$^+$-anode layers 3*a* and 3*b* and the p$^{++}$-contact layers 4*a* and 4*b* of the seventh embodiment because the side walls of the trenches are substantially perpendicular to the anterior surface of the substrate. Al—Si alloy films 86*a* and 86*b* are disposed on the trench bottoms.

(2) At least the surface of the n-drift layer 82 corresponding to the shallow pn-junctions 87*a* and 87*b* on the trench bottoms (that is, between the p-fused field limiting layers 123 sandwiching the trench bottoms) is masked; ion implantation is applied to form the p-fused field limiting layers 123 rotating the SiC wafer; and a thermal treatment is applied. Thereby, the p-fused field limiting layer 123 is formed. Thereafter, the masking film is removed, Al is implanted by ion implantation into the trench bottoms; and a thermal treatment is applied. Thereby, the shallow pn-junctions 87*a* and 87*b* are formed.

In the ninth embodiment, Ti films 116*a* and 116*b*, pn-main junctions 115*a* and 115*b*, an insulating protective film 118, and an anode electrode film 119 respectively correspond to the Ti films 96*a* and 96*b*, the pn-main junctions 5*a* and 5*b*, the insulating protective film 8, and the anode electrode film 89 of the seventh embodiment. The cross-sectional shapes and dimensions of these regions are different from the regions in the seventh embodiment because the trench side walls are substantially perpendicular to the anterior surface of the substrate.

In the ninth embodiment, when a voltage is applied that is equal to or higher than a predetermined reverse voltage during application of a reverse bias: the n-drift layer 82 sandwiched by the p-fused field limiting layers 123 disposed on the corners of the trench bottoms and disposed beneath the shallow pn-junction portions is pinched off by depletion layers spreading from pn-junctions formed with the p-fused field limiting layers 123; and this enables suppression of any increase of the electric field intensity of the shallow pn-junction portions 87a and 87b under a reverse applied voltage equal to or higher than the above voltage. Therefore, a high reverse withstand voltage can be realized similarly to the seventh embodiment. The process to form the trench-like shape is easier to form fine elevated portions and recesses compared to the process to form the mesa-like shape of the seventh embodiment.

Figure 19:
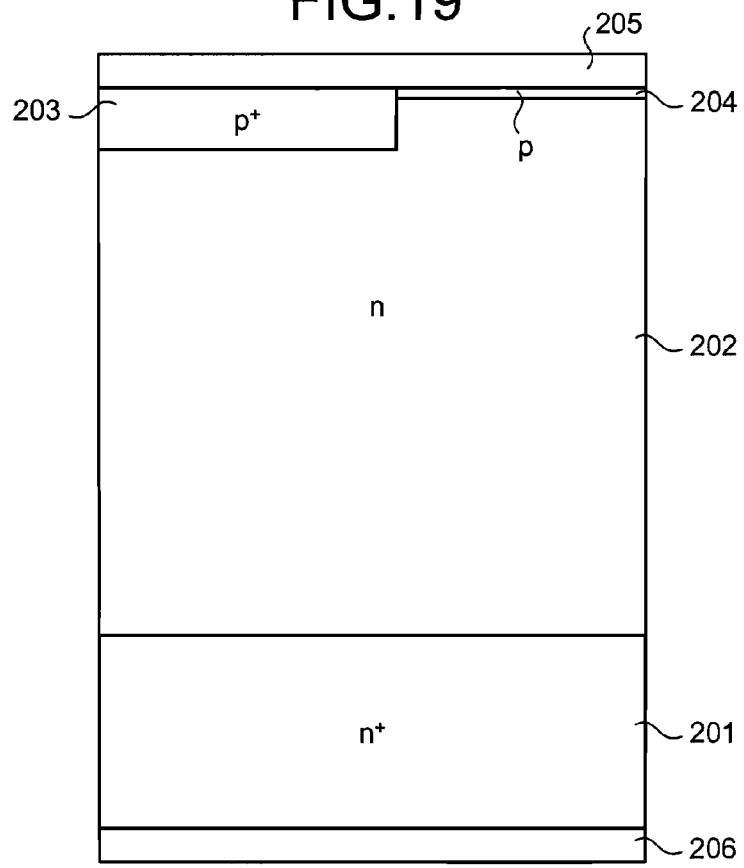
FIG. 19 is a cross-sectional diagram of another example of a conventional complex diode.

The shallow pn-junction 87a is formed at a position deeper than that of the pn-main junction 115a compared to the conventional example (see FIG. 19). The thickness of the p-fused field limiting layer 123 of the complex diode according to the ninth embodiment is set to be, for example, about 0.3 μm and therefore, the distance from the shallow pn-junction 87a to the accumulated carriers remaining in the drift layer beneath the pn-main junction 115a can be easily shortened compared to that in the conventional example. As a result, when the switching operation is turned off, the accumulated carriers can be more quickly and more efficiently discharged through the shallow pn-junction 87a have a built-in voltage (built-in potential) that is lower than that of the pn-main junction 115a than those in the conventional example, and the accumulated carrier vanishing time period can be shortened, thereby enabling a higher switching speed and lower switching loss as compared to the conventional example.

Ninth Example

A complex diode according to the ninth embodiment was fabricated as a ninth example. More specifically, for the complex diode according to the ninth example, for example: the trenches were disposed on the surface of the n-drift layer 82; the shallow pn-junctions 87a and 87b were formed on the trench bottoms; and, thereafter, the Al—Si alloy films 86a and 86b were formed thereon. The width of the trench to be a recess was set to be about 10 μm and the width of the elevated portion (the distance between the recesses) was set to be about 15 μm. As a result, the pinch-off was further effectively enabled and any increase of the electric field concentration on the shallow pn-junctions 87a and 87b was able to further excellently be suppressed. The leak current was able to be reduced when a high voltage was applied. The withstand voltage current density of the leak current was equal to or lower than $0.7 \times 10^{-3}$ A/cm$^2$ at room temperature even when the applied voltage was 10 kV. To form the shallow pn-junctions 87a and 87b: Al was implanted by ion implantation; a thermal treatment was applied; the dose of the Al ion implantation was set to be about $3 \times 10^{16}$ cm$^{-3}$ to be a small amount; and the implantation depth of the ion implantation was set to be 100 nm to be also shallow. Therefore, faults generated by the ion implantation were extremely few and were not at the level that was practicably problematic. In this case, with the dose of the Al ion implantation that was equal to or lower than about $8 \times 10^{16}$ cm$^{-3}$, even when the implantation depth of the ion implantation was set to be about 600 nm, the leak current was small and no degradation phenomenon was conspicuous that the forward voltage was increased during the operation. Therefore, the faults generated in the shallow pn-junctions 87a and 87b were not practicably problematic and the shallow pn-junctions 87a and 87b were able to sufficiently function favorably.

In the complex diode according to the ninth example, the width, the impurity concentration, and the depth of the JTE 10 were set to respectively be 300 μm, $3 \times 10^{17}$ cm$^{-3}$, and about 0.65 μm. Thereby, the breakdown voltage was 12.6 kV at room temperature and a high withstand voltage was able to be realized. Because the thickness of the drift layer was set to be thick in contrast with the breakdown voltage, a non-punch-through state was established where the depletion layer did not reach the n$^+$-cathode substrate 1 at the time of the breakdown. As a result, many minority carriers accumulated between the depletion layers and the n$^+$-cathode substrate 1 relatively slowly vanish due to recombination. Therefore, significant improvement of the soft-recovery property was able to be facilitated. In the complex diode according to the ninth example, the p-fused field limiting layer 123 mainly functioned as a region to realize the pinch-off and, though the function as an anode to inject carriers was weak, the p-fused field limiting layers 123 were able to be formed with a small dose because the impurity concentration of the p-fused field limiting layers 123 was low. Therefore, faults caused by the ion implantation were able to be reduced and the leak current was able to be reduced.

The reverse recovery time period of the complex diode according to the ninth example was 15 ns and was able to be made quicker when a forward current having the forward current density of about 50 A/cm$^2$ was turned off after the current was caused to flow therein. On the other hand, the reverse recovery current density was about 22 A/cm$^2$ and the switching loss was able to significantly be improved.

As described, according to the ninth embodiment, the same effect as that of the first embodiment can be achieved.

Tenth Embodiment

Figure 12:
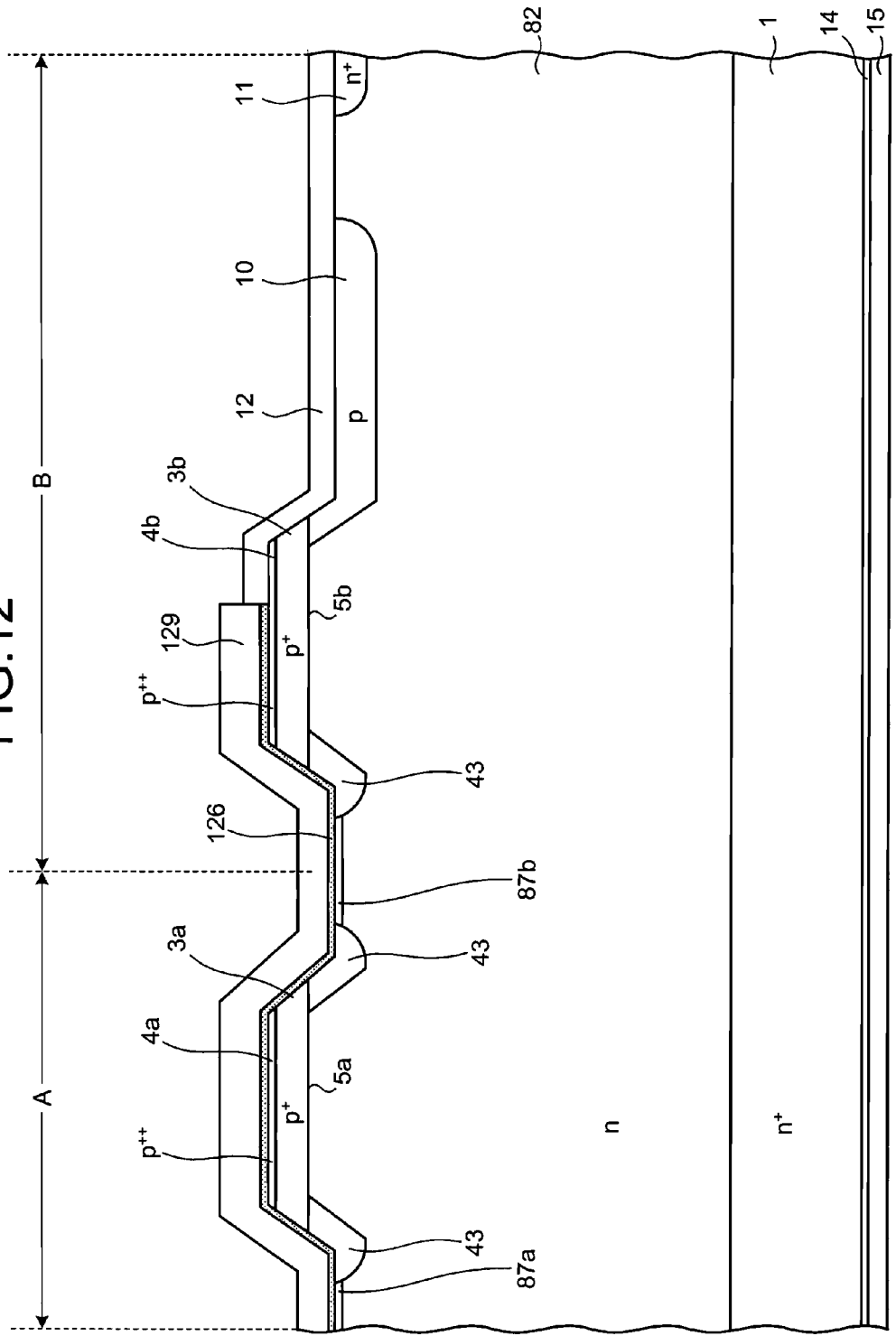
FIG. 12 is a cross-sectional diagram depicting an overview of a complex diode according to a tenth embodiment.

FIG. 12 is a cross-sectional diagram depicting an overview of a complex diode according to a tenth embodiment. The complex diode depicted in FIG. 12 is, for example, a high withstand voltage complex diode having a withstand voltage of an 11-kV class. The complex diode according to the tenth embodiment has shallow pn-junctions disposed therein instead of the Schottky barriers 7a and 7b of the MPS diode according to the third embodiment.

The tenth embodiment has no insulating protective film on the mesa portion side walls on both sides of the p$^+$-anode layers 3a and 3b and the p$^{++}$-contact layers 4a and 4b. An Al—Si alloy film 126 is disposed therein that continuously extends from the p$^{++}$-contact layers 4a and 4b to the mesa bottoms. An anode electrode film 129 is disposed that covers the Al—Si alloy film 126. The other configurations are same as those of the third embodiment.

Tenth Example

A complex diode according to the tenth embodiment was fabricated as a tenth example. More specifically, the complex diode according to the tenth example had the Al—Si alloy film 126 disposed therein that continuously extended from the p$^{++}$-contact layer 4b to the mesa bottom and the p$^{++}$-contact layers 4a. The other configurations were same as those of the MPS diode according to the third example.

As a result, the leak current density of the complex diode according to the tenth example was $6 \times 10^{-3}$ A/cm$^2$ and somewhat increased when a reverse voltage of 16 kV was applied at room temperature. The withstand voltage indicating that the avalanche breakdown was able to be increased to a high withstand voltage that was equal to or higher than 12 kV at room temperature. On the other hand, The Al—Si alloy film 126 had somewhat higher contact resistance compared to the conventional Ti or Ni as an ohmic contact metal and, at room temperature, the forward current density was 45 A/cm$^2$ and the forward voltage was 5.38 V and was somewhat high. It was effective as an improvement countermeasure to form the Al—Si alloy film 126 after forming the Ti film on the p$^{++}$-contact layers 4$a$ and 4$b$. Thereby, the forward voltage was able to be realized at a substantially equal level as that of the MPS diode according to the first example. The reverse recovery time period and the reverse recovery current density acquired when the switching was turned off were substantially equal to those of the MPS diode according to the first example and were excellent.

Instead of the Al—Si alloy film 126, a process was extremely effective as a countermeasure to improve the reduction of the forward voltage: of ion-implanting Al into the region to form the Al—Si alloy film 126; executing a thermal treatment therefor; thereafter, forming a Ti film on the p$^{++}$-contact layers 4$a$ and 4$b$; and covering the Ti film with the cathode electrode film 129 made of Al. In this case, the dose of the Al ion implantation was set to be about 5×10$^{16}$ cm$^{-3}$ to be small, and the implantation depth was set to be 80 nm to be shallow. Therefore, the faults generated during the ion implantation were extremely few and did not reach the level that was practicably problematic. In this case, with the dose of the Al ion implantation that was equal to or smaller than about 8×10$^{16}$ cm$^{-3}$, even when the implantation depth of the ion implantation was set to be about 600 nm, the leak current was small and no degradation phenomenon was conspicuous that the forward voltage was increased during the operation. Therefore, the faults generated in the shallow pn-junctions 87$a$ and 87$b$ were not practicably problematic and the shallow pn-junctions 87$a$ and 87$b$ were able to sufficiently excellently function. The reverse recovery time period and the reverse recovery current density acquired when the switching was turned off were substantially equal to those of the MPS diode according to the first example and were excellent.

As described, according to the tenth embodiment, a same effect as that of the first embodiment can be achieved.

Eleventh Embodiment

Figure 13:
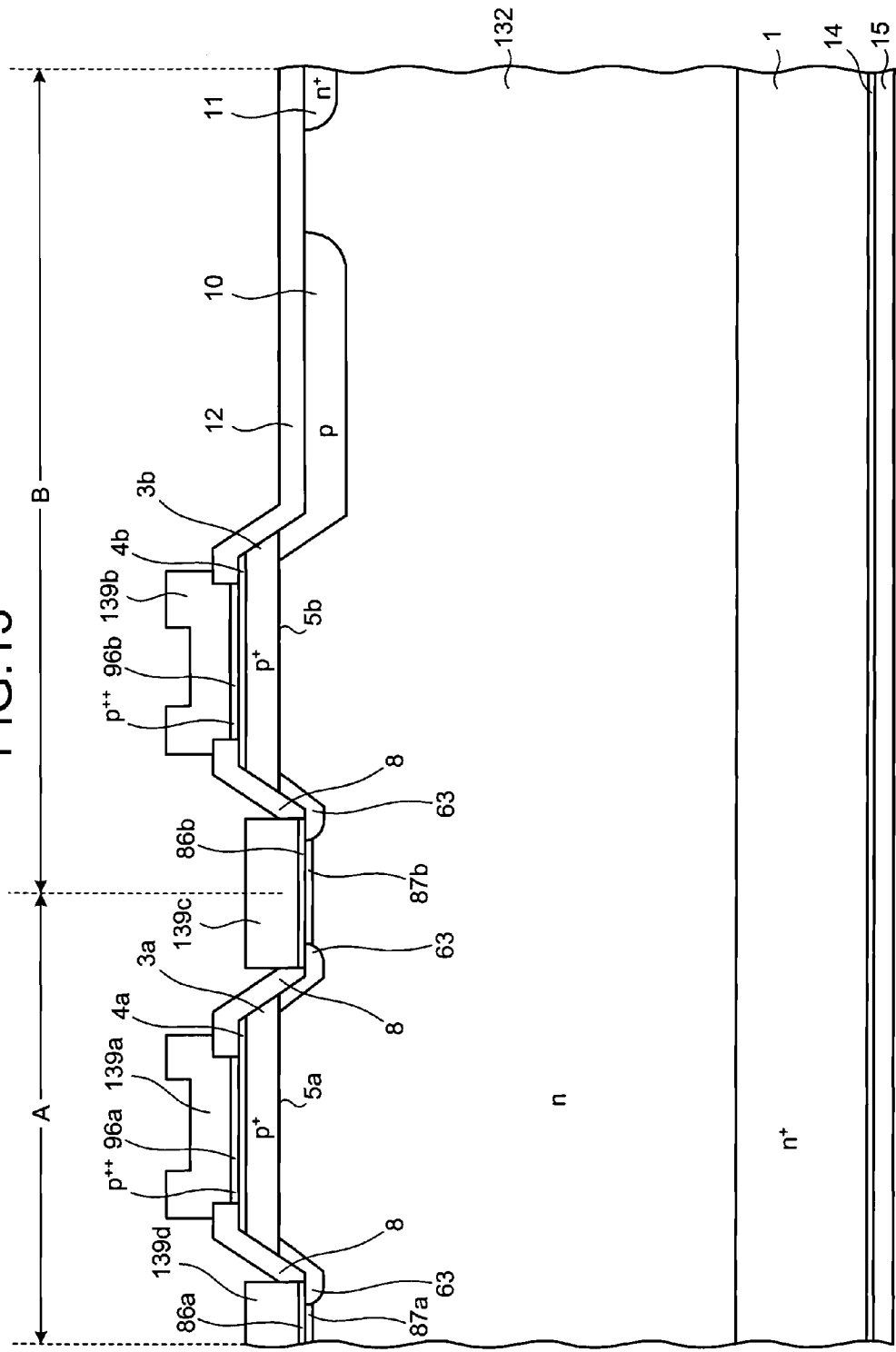
FIG. 13 is a cross-sectional diagram depicting an overview of a complex diode according to an eleventh embodiment.

FIG. 13 is a cross-sectional diagram depicting an overview of a complex diode according to an eleventh embodiment. The diode depicted in FIG. 13 is a high withstand voltage complex diode having a withstand voltage of a 20-kV class. The complex diode according to the eleventh embodiment has shallow pn-junctions disposed therein instead of the Schottky barriers 7$a$ and 7$b$ of the MPS diode according to the fifth embodiment.

In the eleventh embodiment, such films are each separated from each other as anode electrode films 139$a$ and 139$b$ made of Al and disposed above the pn-junctions 5$a$ and 5$b$, and anode electrode films 139$d$ and 139$c$ made of Al and disposed above the shallow pn-junctions 87$a$ and 87$b$. The impurity concentration of an n-drift layer 132 was set to be, for example, 2×10$^{14}$ cm$^{-3}$ to be lower than that of the complex diode according to the seventh embodiment. The thickness of the n-drift layer 132 was set to be 220 µm to be thicker than that of the complex diode according to the seventh embodiment. The other configurations are same as those of the complex diode according to the fifth embodiment.

The complex diode according to the eleventh embodiment has a planar layout as follows. As depicted in FIG. 9, the JTE 10 in contact with the p$^+$-anode layer 3$b$ encompasses the outer peripheral portions of the complex unit group including the 30 units 20 and the one p$^+$-anode layer 3$b$ disposed in parallel to the complex unit group in the direction for the units 20 to be arranged. On the other hand, the p$^+$-layer extending in the direction for the units 20 to be arranged (laterally long p$^+$-layer, not depicted) is separately disposed in contact with the 31 p$^+$-anode layers 3$a$ and 3$b$ and the 30 shallow pn-junctions 87$a$ and 87$b$, in the outer peripheral portions of the complex unit group including 30 units 20 and the one p$^+$-anode layer 3$b$ disposed in parallel to the complex unit group in the direction perpendicular to the direction for the units 20 to be arranged. The outer peripheral portion of the laterally long p$^+$-layer is surrounded by the JTE 10 in contact with the laterally long p$^+$-layer. The channel stopper 11 encompasses the outer peripheral portion of the JTE 10.

The Ti film to be the ohmic contact metal and the Al electrode are formed on the laterally long p$^+$-layer (not depicted) and are connected to the anode electrode films 139$a$, 139$b$, 139$c$, and 139$d$ disposed above the p$^+$-anode layers 3$a$ and 3$b$. Therefore, the laterally long p$^+$-layer functions as the p$^+$-anode layer. The anode electrode films 139$a$, 139$b$, 139$c$, and 139$d$ extend on the insulating protective film in contact with the end of the laterally long p$^+$-layer. However, it is presumed that the influence of the voltage drop in these portions is not at the level that is practicably problematic because the area ratios thereof are small.

In the complex diode according to the eleventh embodiment, no anode electrode film is present on slopes on both sides of the P$^+$-anode layers 3$a$ and 3$b$ and therefore, no carrier induction occurs on the SiC slopes due to an electric field effect of the anode electrode films when a reverse voltage is applied. Therefore, compared to the MPS diode according to the first example, a high withstand voltage can be realized that is stable and has low dispersion.

Eleventh Example

The complex diode according to the eleventh embodiment was fabricated as an eleventh example. More specifically, the complex diode according to the eleventh example had the shallow pn-junctions 87$a$ and 87$b$ disposed therein instead of the Schottky barriers of the MPS diode according to the fifth example. The complex diode had anode electrode films made of Al disposed therein instead of the anode electrode films made of Au. The withstand voltage indicating the avalanche breakdown of the complex diode according to the eleventh example was equal to or higher than 21 kV and was high at room temperature, and the dispersion of the leak current was also able to be significantly reduced to 40% of that of the MPS diode according to the first example. On the other hand, the reverse recovery time period and the reverse recovery current density acquired when the switching was turned off were substantially equal to those of the MPS diode according to the first example and were excellent.

As described, according to the eleventh embodiment, the same effect as that of each of the first and the fifth embodiments can be achieved.

Twelfth Embodiment

Figure 14:
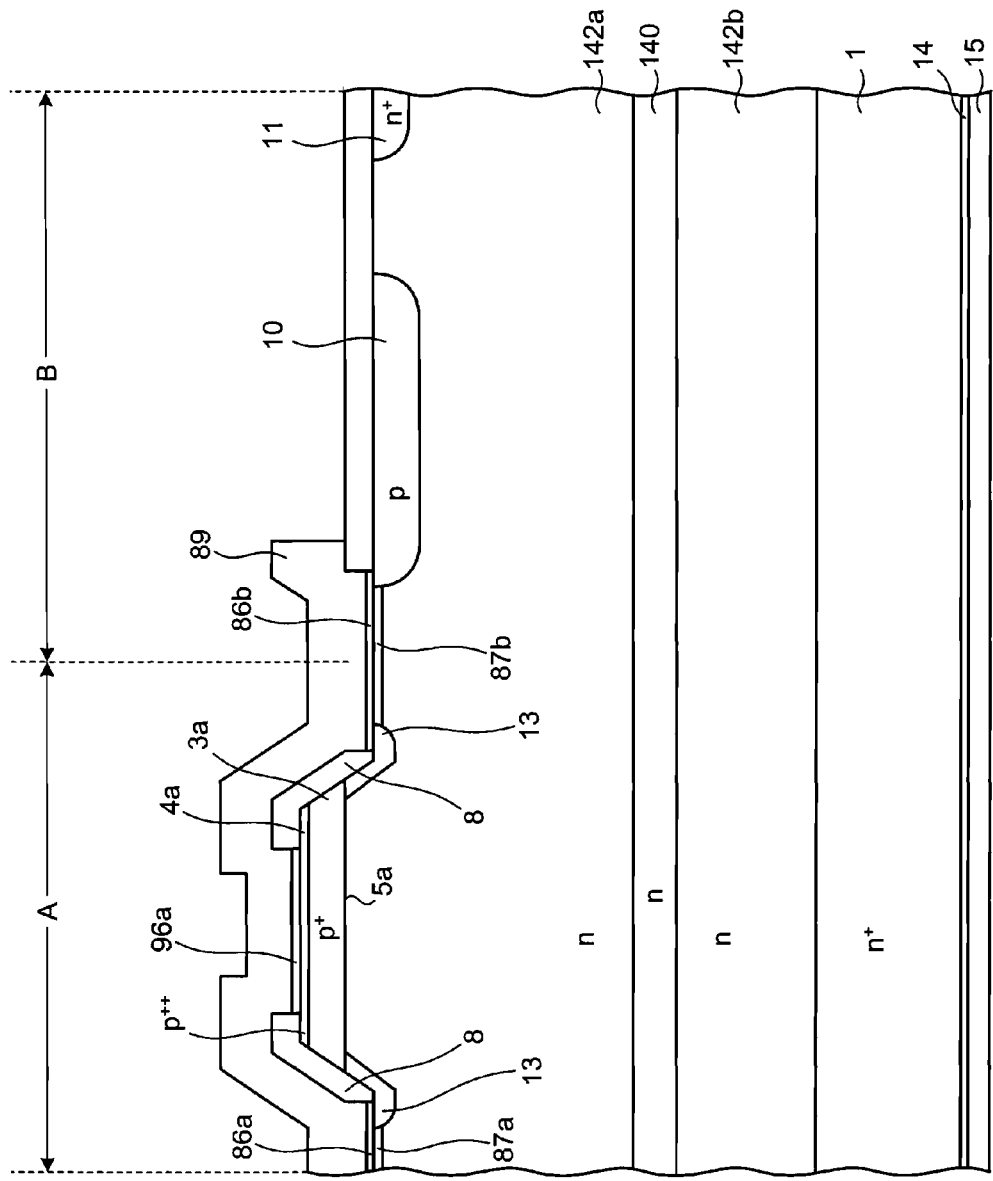
FIG. 14 is a cross-sectional diagram depicting an overview of a complex diode according to a twelfth embodiment.

FIG. 14 is a cross-sectional diagram depicting an overview of a complex diode according to a twelfth embodiment. The complex diode depicted in FIG. 14 is a high withstand voltage complex diode having a withstand voltage of a 15-kV class.

The complex diode according to the twelfth embodiment may have no pn-main junction 5b disposed in the outermost peripheral portion B of the complex diode according to the seventh embodiment. The complex diode may have an n-buffer layer disposed in the n-drift layer.

The complex diode according to the twelfth embodiment has no p+-anode layer 3b and no p++-contact layer 4b disposed therein to constitute the pn-main junction 5b in the outermost peripheral portion B. The JTE 10 overlaps with an end of the shallow pn-junction 87b and is in contact therewith. The width of the overlapping portion may be, for example, about 3 μm. The width of the shallow pn-junction 87a is 40 μm similar to that of the seventh embodiment. The other configurations are same as those of the seventh embodiment.

In the complex diode according to the seventh embodiment, the width of the p+-anode layer 3b in the outermost peripheral portion B is equal to the width of the p+-anode layer 3a in the complex unit A and therefore, when the switching operation is turned off, the discharge time period of the accumulated carriers in the n-drift layer 82 in the outermost peripheral portion B becomes longer than the discharge time period of the accumulated carriers in the n-drift layer 82 in the complex unit A. As a result, the reverse recovery time period becomes long. The reason for this is that, in the complex unit A of the seventh embodiment, the remaining carriers under the pn-main junctions 5a and 5b are discharged from both sides by the shallow pn-junctions 87a and 87b formed on the mesa bottoms on both sides of the p+-anode layer 3a, whereas, in the outmost peripheral portion B, the remaining carriers are discharged only from the side of the one shallow pn-junction 87b. In the twelfth embodiment, no p+-anode layer is present in the outermost peripheral portion B and this eliminates the unevenness of the discharge time period of the accumulated carriers in the p+-anode layer at the ends as in the seventh embodiment, and the reverse recovery time period can be shortened.

The n-buffer layer (sixth semiconductor region) 140 is disposed at a position closer to the n+-cathode substrate 1 than the center of the n-drift layer, has impurity concentration that is $6\times10^{14}$ cm$^{-3}$ and is higher than that of the n-drift layer, and has thickness that is about 5 μm. The n-buffer layer 140 is disposed in the n-drift layer in parallel to the surface of the n+-cathode substrate 1, that is thinner than the n+-cathode substrate 1 and has an impurity concentration that is higher than that of the n+-cathode substrate 1. The n-buffer layer 140 is disposed in the n-drift layer at the depth on the side of the n+-cathode substrate 1 of the depth that is a half of the depth of the n-drift layer. More specifically, an n-drift layer 142b, the n-buffer layer 140, and an n-drift layer 142a are sequentially stacked on the n+-cathode substrate 1.

Due to the n-buffer layer 140, when the switching is turned off, the expanding speed of the depletion layers expanding from the pn-main junction 5a and the shallow pn-junctions 87a and 87b is suppressed once by the n-buffer layer 140. Therefore, during this suppression, the minority carriers in the n-drift layer 142a are quickly discharged that are located closer to the anode than to the n-buffer layer 140. Thereafter, the depletion layers advance toward the n-drift layer 142b on the cathode side rather than toward the n-buffer layer 140. However, optimization of the position of the n-buffer layer 140 (for example, to a position at 50 to 70 μm away from the n+-cathode substrate 1) enables significant suppression of the advancement and the expansion of the depletion layers. As a result, the majority of the minority carriers on the cathode side of the n-buffer layer 140 are slowly reduced not by the discharge through the expansion of the depletion layers but only by recombination. Because of this, the reduction speed of the minority carriers can be significantly suppressed and the corresponding di/dt can be reduced. Therefore, significant improvement of the soft recovery property can be achieved.

Twelfth Example

A complex diode according to the twelfth embodiment was fabricated as a twelfth example. The complex diode according to the twelfth example had no p+-anode layer 3b disposed in the outermost peripheral portions B. The complex diode had the n-buffer layer 140 disposed in the n-drift layer. The other configurations were same as those of the complex diode according to the seventh example. The leak current of the complex diode according to the twelfth example was equal to or lower than $4\times10^{-3}$ A/cm$^2$ and was excellent at room temperature, and the withstand voltage, which indicates the avalanche breakdown, was 16 kV at room temperature and was able to be a high withstand voltage. The reverse recovery time period was 18 ns when a forward current having the forward current density of about 50 A/cm$^2$ was turned off after the current was caused to flow therein. The reverse recovery current density was about 26 A/cm$^2$ and was low, and di/dt was able to be reduced to a half thereof. The soft recovery property was able to significantly be improved.

As described, according to the twelfth embodiment, the same effect as that of the first embodiment can be achieved.

Thirteenth Embodiment

Figure 15:
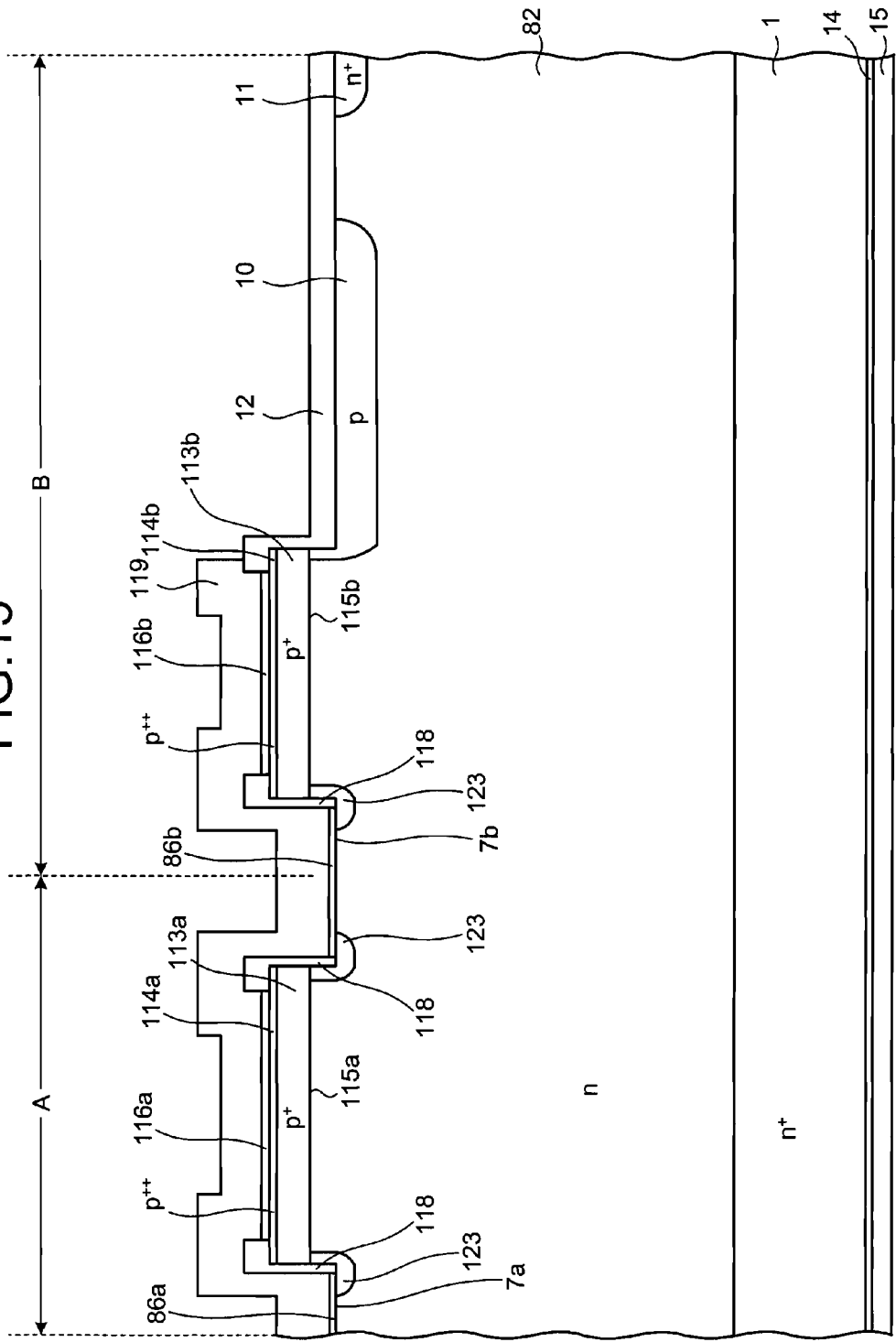
FIG. 15 is a cross-sectional diagram depicting an overview of a complex diode according to a thirteenth embodiment.

FIG. 15 is a cross-sectional diagram depicting an overview of a complex diode according to a thirteenth embodiment. The complex diode depicted in FIG. 15 is, for example, a high withstand voltage complex diode having a withstand voltage of a 10-kV class. The complex diode according to the thirteenth embodiment has Schottky barriers instead of the shallow pn-junctions of the complex diode according to the ninth embodiment. The other configurations are same as those of the ninth embodiment.

In the complex diode according to the thirteenth embodiment, when a voltage equal to or higher than a predetermined reverse voltage is applied thereto during reverse biasing, the n-drift layers 82 disposed beneath the Schottky barriers 7a and 7b each sandwiched by the p-fused field limiting layers 123 disposed on the corners of the trench bottoms is pinched off by the depletion layers expanding from the pn-junctions formed with the p-fused field limiting layers 123, and this enables suppression of any increase of the electric field intensity of the Schottky barriers 7a and 7b for a reverse applied voltage equal to or higher than the above voltage. Therefore, a high reverse withstand voltage can be realized additionally because the process to form the trench-like shape is easier to form fine elevated portions and recesses compared to the process to form the mesa-like shape similarly to the ninth embodiment.

The Schottky barriers 7a and 7b are formed at deeper positions than those of the pn-main junctions 115a and 115b and therefore, the distance can be easily shortened from the Schottky barriers 7a and 7b to the accumulated carriers remaining in the n-drift layer 82 beneath the pn-main junctions 115a and 115b. As a result, when the switching is turned off, the accumulated carriers can be more quickly and more efficiently discharged through the Schottky barriers 7a and 7b having a built-in voltage that is lower than that of the pn-main junction 115a. Thereby, the accumulated carrier vanishing time period can be shortened and, as a result, the switching speed can be further increased and the switching loss can be further reduced.

In the thirteenth embodiment, the p-fused field limiting layers 123 mainly function as regions to realize the pinch-off and the function as an anode to inject carriers is weak. However, because the impurity concentration of the p-fused field limiting layers 123 is low: the p-fused field limiting layers 123 can be formed with a small dose; the faults caused by the ion implantation can be reduced; and the leak current can be reduced.

Thirteenth Example

A complex diode according to the thirteenth embodiment was fabricated as a thirteenth example. More specifically, the complex diode according to the thirteenth example had the trenches disposed on the surface of the n-drift layer 82 and had the Al—Si alloy films 86a and 86b disposed on the trench bottoms. The complex diode had no shallow pn-junctions 87a and 87b formed therein. The other configurations were same as those of the complex diode according to the ninth example. The width, the impurity concentration, and the depth of the JTE 10 were respectively set to be 300 μm, $3 \times 10^{17}$ cm$^{-3}$, and about 0.65 μm. In this case, the reverse applied voltage was 11.2 kV at room temperature and with the leak current density of $1 \times 10^{-3}$ A/cm$^2$ and the breakdown voltage was 12.3 kV at room temperature. A high withstand voltage was able to be realized. The thickness of the n-drift layer 82 was set to be thick in contrast with the breakdown voltage and therefore, a non-punch-through state was established where the depletion layer did not reach the n$^+$-cathode substrate 1 at the time of the breakdown. As a result, many minority carriers accumulated between the depletion layers and the n$^+$-cathode substrate 1 relatively slowly vanish due to recombination. Therefore, significant improvement of the soft-recovery property was able to be facilitated.

The reverse recovery time period of the complex diode according to the thirteenth example was 14 ns when a forward current with the forward current density of about 50 A/cm$^2$ was turned off after the current was caused to flow therein, and was able to be made quick. On the other hand, the reverse recovery current density was about 24 A/cm$^2$ and the switching loss was substantially equal to that of the ninth embodiment.

As described, according to the thirteenth embodiment, the same effect as that of the first embodiment can be achieved.

Fourteenth Embodiment

Figure 16:
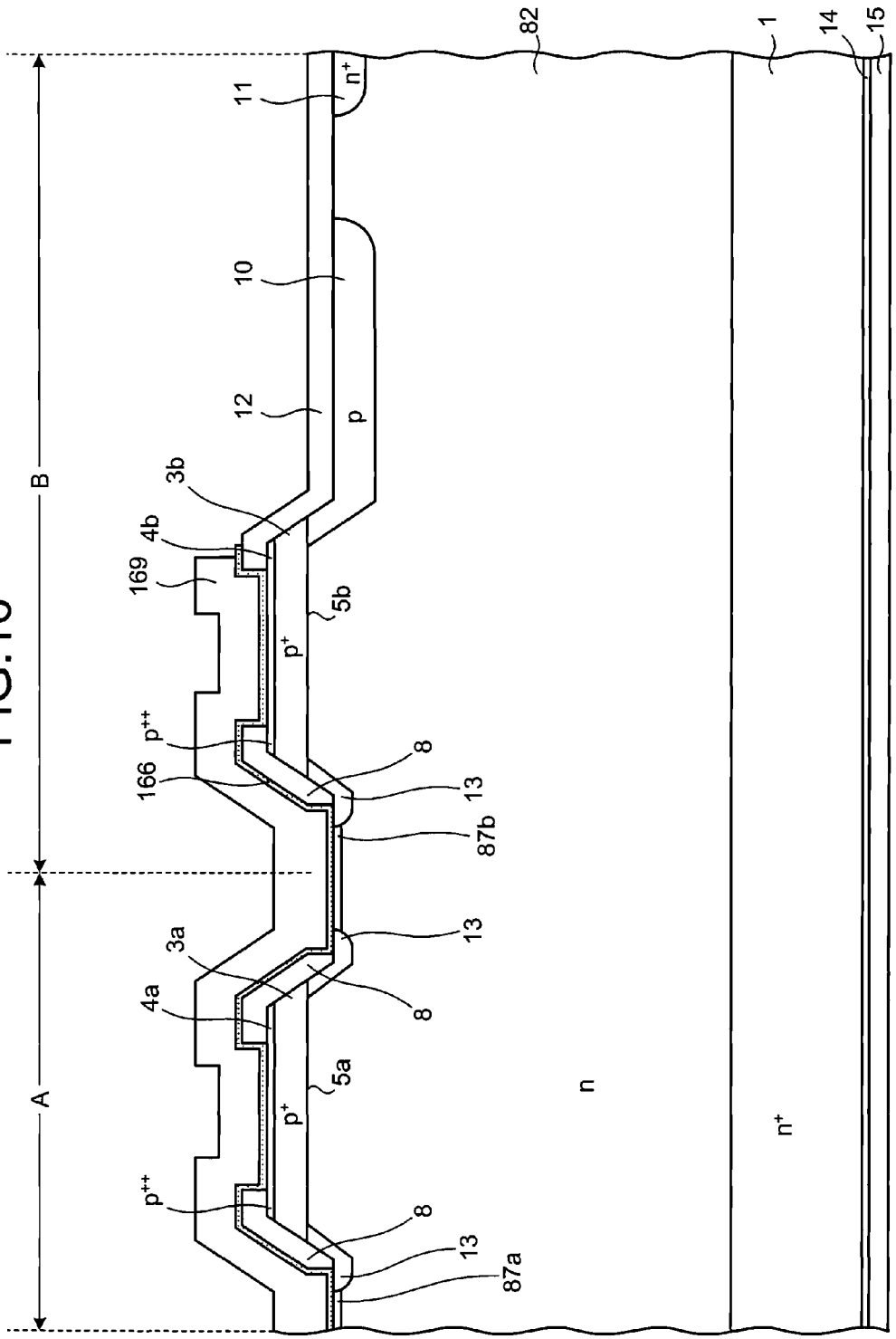
FIG. 16 is a cross-sectional diagram depicting an overview of a complex diode according to a fourteenth embodiment.

FIG. 16 is a cross-sectional diagram depicting an overview of a complex diode according to a fourteenth embodiment. The complex diode depicted in FIG. 16 is, for example, a high withstand voltage complex diode having a withstand voltage of a 15-kV class. The complex diode according to the fourteenth embodiment has one Al—Si alloy film disposed therein covering substantially the entire anterior surface of the n$^+$-cathode substrate 1 instead of the multiple Al—Si alloy films of the complex diode according to the seventh embodiment.

As depicted in FIG. 16, the complex diode according to the fourteenth embodiment has one Al—Si alloy film 166 disposed on the anterior surface of the n$^+$-cathode substrate 1. The Al—Si alloy film 166 is in contact with the shallow pn-junctions 87a and 87b, and the p$^{++}$-contact layers 4a and 4b. The Al—Si alloy film 166 forms ohmic contacts with the shallow pn-junctions 87a and 87b, and the p$^{++}$-contact layers 4a and 4b. The Al—Si alloy film 166 also extends on the insulating protective films 8 disposed on the mesa-portion side surfaces of the p$^+$-anode layer 3a and the p$^{++}$-contact layer 4a. An anode electrode film 169 is disposed on the Al—Si alloy film 166 covering the Al—Si alloy film 166. The other configurations are same as those of the complex diode according to the seventh embodiment.

In the fourteenth embodiment, the difficult lift-off process that is executed when the Al—Si alloy film and the ohmic contact are formed in the seventh embodiment can be omitted, and the Al—Si alloy film 166 on the passivation film 12 only has to be removed by etching. As a result, simplification of the diode apparatus manufacturing process can be facilitated and the yield can be significantly improved. Therefore, improved economic efficiency can be facilitated. On the other hand, the Al—Si alloy film 166 has a somewhat larger contact resistance compared to that of the conventionally used Ti or Ni as the ohmic contact metal, and the forward voltage that is somewhat high at room temperature and with the forward current density of 45 A/cm$^2$, was 5.4 V. Therefore, preferably, after the Ti film is formed on the p$^{++}$-contact layers 4a and 4b, the Al—Si alloy film 166 is formed on this Ti film. Thereby, the forward voltage was able to be realized at the same level as that of the complex diode according to the seventh embodiment.

In the fourteenth embodiment, the Al—Si alloy film 166 and the anode electrode film constituted by the anode electrode film 169 are not in direct contact with the p-fused field limiting layers 13. As a result, even when a high reverse voltage is applied, the p-fused field limiting layers 13 are prevented from being punched through. Therefore, the withstand voltage indicating the avalanche breakdown was able to be increased to 15 kV or higher at room temperature, and the withstand voltage current density of the leak current was $2 \times 10^{-3}$ A/cm$^2$ or lower at room temperature when the applied voltage was 10 kV. Excellent properties were able to be maintained that were at substantially the equal level compared to the seventh embodiment. The reverse recovery time period and the reverse recovery current density acquired when the switching was turned off were substantially same and were excellent.

As described, according to the fourteenth embodiment, the same effect as that of the seventh embodiment can be achieved.

Fifteenth Embodiment

Figure 17:
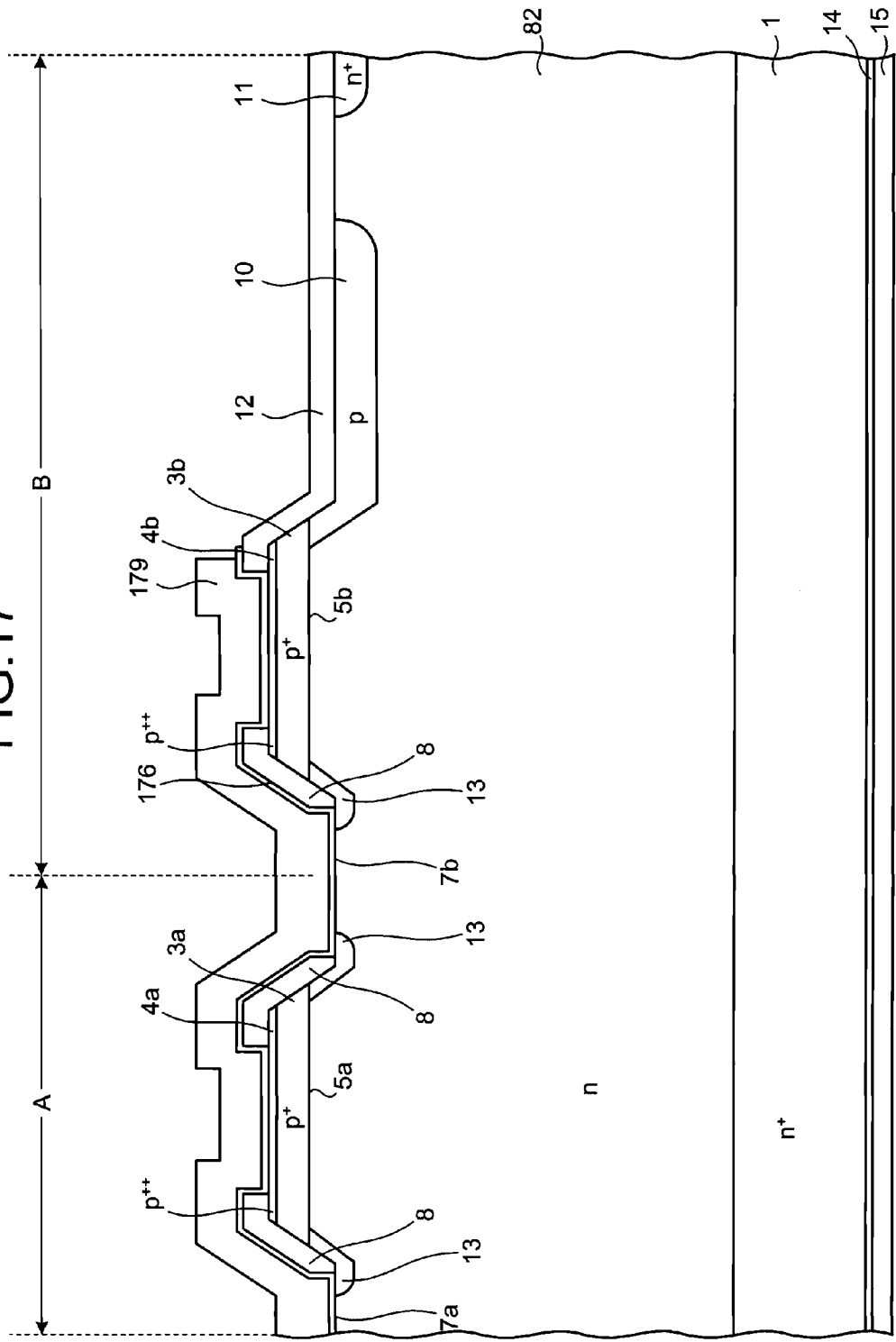
FIG. 17 is a cross-sectional diagram depicting an overview of a complex diode according to a fifteenth embodiment.

FIG. 17 is a cross-sectional diagram depicting an overview of a complex diode according to a fifteenth embodiment. The complex diode depicted in FIG. 17 is, for example, a high withstand voltage complex diode having a withstand voltage of a 15-kV class. The complex diode according to the fifteenth embodiment has a Ti film disposed therein instead of the Al—Si alloy films of the complex diode according to the fourteenth embodiment.

In the fifteenth embodiment, the Ti film 176 acts as both the ohmic contact metal for the pn-main junctions 5a and 5b, and a Schottky metal for the Schottky barriers 7a and 7b. The Ti film 176 also extends on the insulating protective films 8 disposed on each mesa-portion side-surface of the p$^+$-anode layers 3a and 3b and the p$^{++}$-contact layers 4a and 4b. Disposing the Ti film 176 connects the pn-main junctions 5a and 5b with the p$^{++}$-contact layers 4a and 4b, and the Schottky barriers 7a and 7b with the n-drift layer 82. The other configurations are same as those of the fourteenth embodiment. An anode electrode film 179 is formed that is thick and made of Al, on the Ti film 176 to reduce the electric resistance.

The withstand voltage indicating the avalanche breakdown of the complex diode according to the fifteenth embodiment was able to be increased and was about 16 kV or higher. The reason for this is same as that for the complex diode according to the fourteenth embodiment.

As described, according to the fifteenth embodiment, the same effect as that of the fourteenth embodiment can be achieved.

As described, the first to the fifteenth embodiments have been described in detail. However, not limiting to the embodiments, the present invention is further applicable to many application scopes and derivative configurations. The present invention is applicable to diodes having yet higher withstand voltages such as, for example, 25 kV and 50 kV by variously changing the design conditions, etc., of each of the regions. The positions at which the pn-main junctions and the Schottky barriers are formed, may also be changed. For example, the pn-main junctions may be disposed at positions deeper than those of the Schottky barriers by forming the trenches in the n-drift layer and burying the trenches with the $p^+$-epitaxial layer.

Cases have been described where the field limiting layers are JTEs. However, other field limiting layers may be used such as FLR and RESURF, and JETs may be used each configured by multiple regions having respectively different concentrations. Setting the impurity concentrations of the p-fused field limiting regions to be higher for the regions in the vicinity of the portions in contact with the shallow pn-junctions than those for the portions in contact with the pn-junctions is effective in further reducing the leak current and further expediting the carrier injection.

Description has been made using SiC as a wide-gap semiconductor. However, the present invention is applicable to and can be developed for another wide-gap semiconductor diode such as that using GaN or diamond. When the shallow pn-junctions are formed, another alloy film is applicable such as an Al—Ti—Si alloy film or an Al—Ni—Si film. The same effect is also achievable even when the inclination angle of the mesa-portion side-surfaces of the $p^+$-anode layer is changed. The Schottky metal may be formed using molybdenum, etc. In the second and the eighth embodiments, one pinch-off p-layer may be disposed or multiple pinch-off p-layers may be disposed between the p-fused field limiting layers of the shallow pn-junctions. When the width of the entire shallow pn-junction is set to be substantially equal, a higher withstand voltage can be realized with the increase of the number of the pinch-off p-layers. The vanishing time period of the accumulated carriers in the drift layer can be further shortened when the switching is turned off in the case where the width of the entire shallow pn-junction is increased by increasing the width of the shallow pn-junction between the pinch-off p-layers, or increasing the number of pinch-off p-layers and that of shallow pn-junctions while fixing the width of the shallow pn-junction between the pinch-off p-layers.

INDUSTRIAL APPLICABILITY

The present invention is useful for a high withstand voltage high performance wide-gap semiconductor diode suitable for uses requiring a high withstand voltage. More specifically, the present invention is applicable to a high withstand voltage inverter, etc., directly connected to an electric power distribution system. In this case, a transformer may be removed. The present invention enables significant downsizing and weight reduction, and energy saving of the system. The present invention is applicable to not only the existing electric power distribution system but also a smart grid that is a next-generation system network. The present invention is also applicable to a control apparatus for an industrial machine such as a large-sized fan or a pump, or a rolling mill.

EXPLANATIONS OF LETTERS OR NUMERALS

1 $n^+$-cathode substrate
2 $n^-$-drift layer
3a, 3b $p^+$-anode layers
4a, 4b $P^{++}$-contact layers
5a, 5b pn-junctions
6a, 6b Ti film (for Schottky barrier)
16a, 16b Ti film (for ohmic contact)
7a, 7b Schottky barrier
8 insulating protective film
9 anode electrode film
10 JTE
11 channel stopper
12 passivation film
13 p-fused field limiting layer
14 Ni ohmic contact
15 cathode electrode film
30 pinch-off p-layer

The invention claimed is:

1. A semiconductor device comprising:
a first semiconductor region of a first conductivity type and formed of a material having a band gap wider than a band gap of silicon;
a first layer selectively disposed on a surface of the first semiconductor region and forming a first junction with the first semiconductor region;
a second layer selectively disposed on the surface of the first semiconductor region and forming a second junction with the first semiconductor region;
a first diode formed by a region that includes the first junction;
a second diode formed by a region that includes the second junction;
an electrode film is formed over the first layer and the second layer, the electrode film is electrically connected to the first diode and the second diode; and
a fourth semiconductor region of a second conductivity type and disposed in a surface of the first semiconductor region, between the first junction and the second junction, contacting the first junction and the second junction, wherein
a recess and an elevated portion that protrudes more than a bottom aspect of the recess are disposed on the surface of the first semiconductor region,
the first junction and the second junction are formed at different depths from the surface of the first semiconductor region, and
a built-in potential of the second diode is lower than a built-in potential of the first diode.

2. The semiconductor device according to claim 1, wherein the first layer is disposed on a surface of the elevated portion,
the second layer is disposed on the bottom aspect of the recess, and
a depth of the first junction formed on the elevated portion from the surface of the elevated portion is shallower than a depth of the recess.

3. The semiconductor device according to claim 2, wherein an end of the first junction is exposed at a side of the elevated portion.

4. The semiconductor device according to claim 1, wherein a thickness of the second layer is thinner than a thickness of the first layer.

5. The semiconductor device according to claim 1, wherein
the first layer is a second semiconductor region of a second conductivity type,
the second layer is a third semiconductor region of the second conductivity type, and
the third semiconductor region is thinner than the second semiconductor region and has an impurity concentration that is lower than an impurity concentration of the second semiconductor region.

6. The semiconductor device according to claim 5, wherein
the second semiconductor region is an epitaxial layer selectively disposed on the surface of the first semiconductor region, and
the elevated portion is formed by the second semiconductor region.

7. The semiconductor device according to claim 5, wherein the first diode and the second diode are pn-junction diodes.

8. The semiconductor device according to claim 1, wherein
the first layer is a second semiconductor region of a second conductivity type, and
the second layer is a metal film that forms a Schottky barrier with the first semiconductor region.

9. The semiconductor device according to claim 8, wherein
the second semiconductor region is an epitaxial layer selectively disposed on the surface of the first semiconductor region, and
the elevated portion is formed by the second semiconductor region.

10. The semiconductor device according to claim 8, wherein
the first diode is a pn-junction diode, and
the second diode is a Schottky barrier diode.

11. The semiconductor device according to claim 5, wherein
the elevated portion has a tapered shape, and
the fourth semiconductor region is disposed in a surface layer on a side of the recess, between the first junction and the second junction and has an impurity concentration that is lower than an impurity concentration of the second semiconductor region.

12. The semiconductor device according to claim 5, wherein
the recess is a trench formed in a surface that is of the first semiconductor region and where the second semiconductor region to be disposed, and
the fourth semiconductor region is disposed in a surface layer of a side wall of the trench, between the first junction and the second junction and has an impurity concentration that is lower than an impurity concentration of the second semiconductor region.

13. The semiconductor device according to claim 5, wherein
a fifth semiconductor region of a second conductivity type has an impurity concentration that is lower than an impurity concentration of the second semiconductor region and is disposed in a surface layer of a bottom aspect of the recess, and
the second junction formed on the bottom aspect of the recess is divided by the fifth semiconductor region.

14. The semiconductor device according to claim 5, wherein
the third semiconductor region is a region that is formed by ion implantation.

15. The semiconductor device according to claim 8, wherein
the metal film is an alloy film that is formed by vapor-depositing a metal, followed by thermal treatment.

16. The semiconductor device according to claim 1, wherein
the first semiconductor region is disposed on a semiconductor substrate that is of the first conductivity type and is formed of a material having a band gap wider than a band gap of silicon,
a sixth semiconductor region that is thinner than the semiconductor substrate and has an impurity concentration that is higher than an impurity concentration of the semiconductor substrate is disposed inside the first semiconductor region, parallel to a surface of the semiconductor substrate, and
the sixth semiconductor region is disposed deeper toward the semiconductor substrate than an intermediate depth in the first semiconductor region.

17. The semiconductor device according to claim 5, wherein
the semiconductor device has a stripe-like planar layout formed by alternately and repeatedly disposing the first junction and the second junction,
the first junction and the second junction are disposed in a stripe-like pattern,
an end of the second junction is exposed at an outermost peripheral portion in a direction perpendicular to a longitudinal direction of the stripe,
an end of the first junction and an end of the second junction are alternately exposed at an outermost peripheral portion in a direction parallel to the longitudinal direction of the stripe, and
a field limiting layer disposed in the outermost peripheral portion and encompassing the first junction and the second junction contacts the end of the first junction and the end of the second junction that are exposed at the outermost peripheral portion.

18. A semiconductor device according to claim 1, wherein:
the fourth semiconductor region contacting a bottom surface of the first layer and a bottom surface of the second layer.

* * * * *

UNITED STATES PATENT AND TRADEMARK OFFICE
CERTIFICATE OF CORRECTION

| | | |
|---|---|---|
| PATENT NO. | : 8,896,084 B2 | Page 1 of 1 |
| APPLICATION NO. | : 13/578434 | |
| DATED | : November 25, 2014 | |
| INVENTOR(S) | : Yoshitaka Sugawara | |

It is certified that error appears in the above-identified patent and that said Letters Patent is hereby corrected as shown below:

On the Title page item (87)

Change

"PCT Pub. Date: Jan 9, 2011"

To Be

--PCT Pub. Date: Sep. 1, 2011--

Signed and Sealed this
Twenty-third Day of June, 2015

Michelle K. Lee
*Director of the United States Patent and Trademark Office*